US006875657B2

(12) United States Patent
Yue et al.

(10) Patent No.: US 6,875,657 B2
(45) Date of Patent: Apr. 5, 2005

(54) METHOD OF FABRICATING TRENCH MIS DEVICE WITH GRADUATED GATE OXIDE LAYER

(75) Inventors: Christiana Yue, Milpitas, CA (US); Mohamed N. Darwish, Campbell, CA (US); Frederick P. Giles, San Jose, CA (US); Kam Hong Lui, Santa Clara, CA (US); Kuo-In Chen, Los Altos, CA (US); Kyle Terrill, Santa Clara, CA (US); Deva N. Pattanayak, Cupertino, CA (US)

(73) Assignee: Siliconix incorporated, Santa Clara, CA (US)

( * ) Notice: Subject to any disclaimer, the term of this patent is extended or adjusted under 35 U.S.C. 154(b) by 0 days.

(21) Appl. No.: 10/106,896

(22) Filed: Mar. 26, 2002

(65) Prior Publication Data

US 2003/0032248 A1 Feb. 13, 2003

Related U.S. Application Data

(63) Continuation-in-part of application No. 09/927,143, filed on Aug. 10, 2001.

(51) Int. Cl.[7] .............................................. H01L 21/336
(52) U.S. Cl. ...................... 438/270; 438/268; 438/269; 438/271; 438/272; 438/273; 438/274
(58) Field of Search ................................ 438/270, 268, 438/271, 272, 273, 274; 257/330

(56) References Cited

U.S. PATENT DOCUMENTS

| 4,546,367 A | | 10/1985 | Schutten et al. ............ 257/331 |
| 4,683,643 A | * | 8/1987 | Nakajima et al. ........... 438/270 |
| 4,914,058 A | * | 4/1990 | Blanchard ................... 438/270 |
| 4,967,245 A | * | 10/1990 | Cogan et al. ............... 257/331 |
| 5,424,231 A | * | 6/1995 | Yang ......................... 438/270 |

(Continued)

FOREIGN PATENT DOCUMENTS

| EP | 0 801 426 A2 | | 10/1997 |
| JP | 1-192174 A | | 8/1989 |
| JP | 3-211885 | | 9/1991 |
| JP | 6-21468 | | 1/1994 |
| JP | 10032331 | | 2/1998 |
| JP | 11026758 A | | 1/1999 |
| JP | 11-163342 | | 6/1999 |
| JP | 2000269487 | | 8/2000 |
| WO | 98-04004 | * | 1/1998 |
| WO | WO 00/57481 | | 9/2000 |

OTHER PUBLICATIONS

European Patent Office, Patent Abstracts of Japan, vol. 013, No. 483 (E–839), Nov. 2, 1989 (Hitachi).

(Continued)

*Primary Examiner*—Long Pham
(74) *Attorney, Agent, or Firm*—Silicon Valley Patent Group, LLP

(57) ABSTRACT

A process for manufacturing a trench MIS device includes depositing a conformal nitride layer in the trench; etching the nitride layer to create an exposed area at the bottom of the trench; and heating the substrate and thereby growing an oxide layer in the exposed area. This process causes the mask layer to "lift off", creating a "bird's beak" structure. This becomes a "transition region", where the thickness of the oxide layer decreases gradually in a direction away from the exposed area. The method further includes diffusing a dopant into the substrate, the dopant forming a PN junction with a remaining portion of said substrate, and controlling the diffusion such that the PN junction intersects the trench in the transition region. Because the thickness of the oxide layer decreases gradually, the PN junction does not need to be located at a particular point, i.e., there is a margin of error. This improves the manufacturability of the device and enhances its breakdown characteristics.

14 Claims, 23 Drawing Sheets

U.S. PATENT DOCUMENTS

| | | | | |
|---|---|---|---|---|
| 5,442,214 | A | | 8/1995 | Yang .......................... 257/328 |
| 5,473,176 | A | | 12/1995 | Kakumoto ................. 257/192 |
| 5,486,714 | A | * | 1/1996 | Hong ......................... 257/321 |
| 5,882,971 | A | * | 3/1999 | Wen .......................... 438/276 |
| 5,915,180 | A | * | 6/1999 | Hara et al. ................. 438/270 |
| 5,976,936 | A | * | 11/1999 | Miyajima et al. ........... 438/268 |
| 6,020,600 | A | | 2/2000 | Miyajima et al. ............. 257/76 |
| 6,074,909 | A | | 6/2000 | Gruening .................... 438/242 |
| 6,084,264 | A | | 7/2000 | Darwish ..................... 438/270 |
| 6,144,054 | A | | 11/2000 | Agahi et al. ................ 257/296 |
| 6,291,200 | B1 | | 9/2001 | Williams |
| 6,291,298 | B1 | | 9/2001 | Williams et al. ............ 438/270 |
| 6,444,528 | B1 | * | 9/2002 | Murphy ..................... 438/270 |
| 6,569,738 | B2 | | 5/2003 | Darwish ..................... 438/270 |
| 2001/0026989 | A1 | | 10/2001 | Thapat ....................... 438/400 |

OTHER PUBLICATIONS

European Patent Office, Patent Abstracts of Japan, vol. 015, No. 486 (E–1143), Dec. 10, 1991 (Matsushita).

European Patent Office, Patent Abstracts of Japan, vol. 1999, No. 11, Sep. 30, 1999 (NEC Corp.).

U.S. Appl. No. 09/927,143, Darwish et al., filed Aug. 10, 2001.

U.S. Appl. No. 10/106,812, Darwish et al., filed Mar. 26, 2002.

European Patent Office, Abstract of Japan vol. 1999, No. 04, Apr. 30, 1999 (Fuji Electronic Co. Ltd.).

European Patent Office, Abstract of Japan vol. 2000, No. 12, Jan. 3, 2000, (Kaga Toshiba Electron KK).

European Patent Office, Abstract of Japan, vol. 1998, No. 06, Apr. 30, 1998, (Nec Corp).

European Patent Office, Abstract of Japan vol. 1999, No. 08, Jun. 30, 1999, (Toshiba Corp).

* cited by examiner

METHOD OF FABRICATING TRENCH MIS DEVICE WITH GRADUATED GATE OXIDE LAYER

This is a continuation-in-part of application Ser. No. 09/927,143, filed Aug. 10, 2001, which is incorporated herein by reference in its entirety.

CROSS-REFERENCE TO RELATED APPLICATIONS

This application is related to application Ser. No. 09/927,320, filed Aug. 10, 2001, and to application Ser. No. 09/591,179, filed Jun. 8, 2000, each of which is incorporated herein by reference in its entirety.

FIELD OF THE INVENTION

This invention relates to trench metal-insulator-semiconductor (MIS) devices and in particular to trench MOSFETs that are suitable for high frequency operation.

BACKGROUND

Some metal-insulator-semiconductor (MIS) devices include a gate located in a trench that extends downward from the surface of a semiconductor substrate (e.g., silicon). The current flow in such devices is primarily vertical and, as a result, the cells can be more densely packed. All else being equal, this increases the current carrying capability and reduces the on-resistance of the device. Devices included in the general category of MIS devices include metal-oxide-semiconductor field effect transistors (MOSFETs), insulated gate bipolar transistors (IGBTs), and MOS-gated thyristors.

Trench MOSFETs, for example, can be fabricated with a high transconductance ($g_{m,max}$) and low specific on resistance ($R_{on}$), which are important for optimal linear signal amplification and switching. One of the most important issues for high frequency operation, however, is reduction of the MOSFET internal capacitances. The internal capacitances include the gate-to-drain capacitance ($C_{gd}$), which is also called the feedback capacitance ($C_{rss}$), the input capacitance ($C_{iss}$) and the output capacitance ($C_{oss}$).

FIG. 1 is a cross-sectional view of a conventional n-type trench MOSFET 10. In MOSFET 10, an n-type epitaxial ("N-epi") layer 13, which is usually grown on an N+ substrate (not shown), is the drain. N-epi layer 13 may be a lightly doped layer, that is, an N− layer. A p-type body region 12 separates N-epi layer 13 from N+ source regions 11. Current flows vertically through a channel (denoted by the dashed lines) along the sidewall of a trench 19. The sidewall and bottom of trench 19 are lined with a thin gate insulator 15 (e.g., silicon dioxide). Trench 19 is filled with a conductive material, such as doped polysilicon, which forms a gate 14. Trench 19, including gate 14 therein, is covered with an insulative layer 16, which may be borophosphosilicate glass (BPSG). Electrical contact to source regions 111 and body region 12 is made with a conductor 17, which is typically a metal or metal alloy. Gate 14 is contacted in the third dimension, outside of the plane of FIG. 1.

A significant disadvantage of MOSFET 10 is a large overlap region 18 formed between gate 14 and N-epi layer 13, which subjects a portion of thin gate insulator 15 to the drain operating voltage. The large overlap limits the drain voltage rating of MOSFET 10, presents long term reliability issues for thin gate insulator 15, and greatly increases the gate-to-drain capacitance, $C_{gd}$, of MOSFET 10. In a trench structure, $C_{gd}$ is larger than in conventional lateral devices, limiting the switching speed of MOSFET 10 and thus its use in high frequency applications.

One possible method to address this disadvantage is described in the above-referenced application Ser. No. 09/591,179 and is illustrated in FIG. 2. FIG. 2 is a cross-sectional view of a trench MOSFET 20 with an undoped polysilicon plug 22 near the bottom of trench 19. MOSFET 20 is similar to MOSFET 10 of FIG. 1, except for polysilicon plug 22, which is isolated from the bottom of trench 19 by oxide layer 21 and from gate 14 by oxide layer 23. The sandwich of oxide layer 21, polysilicon plug 22, and oxide layer 23 serves to increase the distance between gate 14 and N-epi layer 13, thereby decreasing $C_{gd}$.

In some situations, however, it may be preferable to have a material even more insulative than undoped polysilicon in the bottom of trench 19 to minimize $C_{gd}$ for high frequency applications.

One possible method to address this issue is described in the above-referenced application Ser. No. 09/927,320 and is illustrated in FIG. 3. FIG. 3 is a cross-sectional view of a trench MOSFET 30 with a thick insulative layer 31 near the bottom of trench 19. MOSFET 30 is similar to MOSFET 10 of FIG. 1 and MOSFET 20 of FIG. 2. In MOSFET 30, however, only the sidewall of trench 19 is lined with thin gate insulator 15 (e.g., silicon dioxide). Unlike MOSFET 10 of FIG. 1, a thick insulative layer 31 (e.g., silicon dioxide) lines the bottom of trench 19 of MOSFET 30 of FIG. 3. Thick insulative layer 31 separates gate 14 from N-epi layer 13. This circumvents the problems that occur when only thin gate insulator 15 separates gate 14 from N-epi layer 13 (the drain) as in FIG. 1. Thick insulative layer 31 provides a more effective insulator than is achievable with polysilicon plug 22 as shown in FIG. 2. Thick insulative layer 31 decreases the gate-to-drain capacitance, $C_{gd}$, of MOSFET 30 compared to MOSFET 20 of FIG. 2.

The solution of FIG. 3 has a thin gate oxide region 24 between body region 12 and thick insulative layer 31. This is because the bottom interface of body region 12 and the top edge of thick insulative layer 31 are not self-aligned. If body region 12 extends past the top edge of thick insulative layer 31, MOSFET 30 could have a high on-resistance, $R_{on}$, and a high threshold voltage. Since such alignment is difficult to control in manufacturing, sufficient process margin can lead to significant gate-to-drain overlap in thin gate oxide regions 24. Thin gate region 24 also exists in MOSFET 20 of FIG. 2, between body region 12 and polysilicon plug 22. Thus, $C_{gd}$ can still be a problem for high frequency applications. Accordingly, a trench MOSFET with decreased gate-to-drain capacitance, $C_{gd}$, and better high frequency performance is desirable.

SUMMARY

In accordance with the present invention, a metal-insulator-semiconductor (MIS) device includes a semiconductor substrate including a trench extending into the substrate from a surface of the substrate. A source region of a first conductivity type is adjacent to a sidewall of the trench and to the surface of the substrate. A body region of a second conductivity type opposite to the first conductivity type is adjacent to the source region and to the sidewall and to a first portion of a bottom surface of the trench. A drain region of the first conductivity type is adjacent to the body region and to a second portion of the bottom surface of the trench. The trench is lined with a first insulative layer at least along the sidewall that abuts the body region and at least along the first portion of the bottom surface that abuts the body region. The trench is also lined with a second insulative layer along the second portion of the bottom surface of the trench. The second insulative layer is coupled to the first insulative layer, and the second insulative layer is thicker than the first insulative layer.

In an exemplary embodiment of a fabrication process for such an MIS device, a trench including a sidewall, a corner surface, and a central bottom surface is formed in a substrate. A thick insulative layer is deposited on the central bottom surface. A thin insulative layer is formed on the sidewall and on the corner surface. A gate is formed around and above the thick insulative layer and adjacent to the thin insulative layer in the trench, so as to form an active corner region along at least a portion of the corner surface.

In one embodiment, the thick insulative layer is deposited using a mask layer that is deposited and etched to expose a central portion of the bottom surface of the trench. The thick insulative layer is deposited and etched to form an exposed portion of the mask layer on the sidewall, leaving a portion of the thick insulative layer on the central portion of the bottom surface of the trench. The mask layer is removed, exposing the sidewall and the corner surface of the trench, while leaving the portion of the thick insulative layer on the central portion of the bottom surface of the trench.

The thick insulative layer separates the trench gate from the drain conductive region at the bottom of the trench, while the active corner regions minimize the gate-to-drain overlap in thin gate insulator regions. This results in a reduced gate-to-drain capacitance, making MIS devices in accordance with the present invention, such as trench MOSFETs, suitable for high frequency applications.

In an alternative embodiment, the trench is lined with an oxide layer. The oxide layer comprises a first section, a second section and a transition region between said first and second sections. The first section is adjacent at least a portion of the drain region of the device, and the second section is adjacent at least a portion of the body region of the device. The thickness of the oxide layer in said first section is greater than the thickness of said oxide layer in the second section. The thickness of the oxide layer in the transition region decreases gradually from the first section to the second section. A PN junction between the body region and the drain region terminates at the trench adjacent said transition region of said oxide layer.

BRIEF DESCRIPTION OF THE DRAWINGS

This invention will be better understood by reference to the following description and drawings. In the drawings, like or similar features are typically labeled with the same reference numbers.

DESCRIPTION OF THE INVENTION

Figure 4:
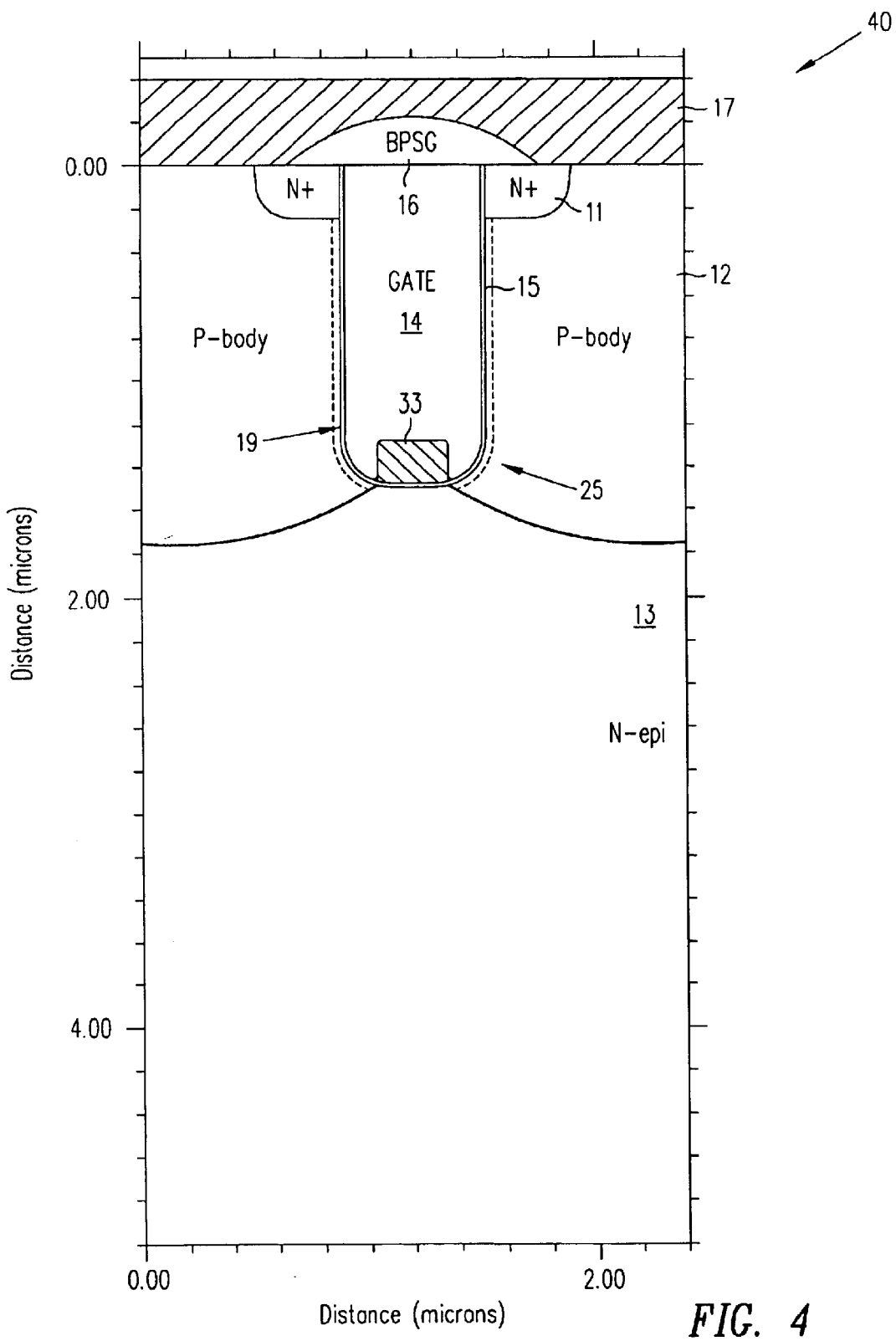
FIG. 4 is a cross-sectional view of one embodiment of a trench MOSFET in accordance with the present invention.

FIG. 4 is a cross-sectional view of one embodiment of a trench MOSFET 40 in accordance with the present invention. In MOSFET 40, an n-type epitaxial ("N-epi") layer 13, which may be an N$^-$ layer and is usually grown on an N$^+$ substrate (not shown), is the drain. A p-type body region 12 separates N-epi layer 13 from N$^+$ source regions 11. Body region 12 is diffused along the sidewall of a trench 19, past a corner region 25, and partially long the bottom of trench 19. Current flows vertically through a channel (denoted by the dashed lines) along the sidewall and around corner region 25 of trench 19.

The sidewall and corner region 25 of trench 19 are lined with a thin gate insulator 15 (e.g., silicon dioxide). An oxide plug 33 is centrally located in the bottom of trench 19. Trench 19 is filled with a conductive material, such as doped polysilicon, which forms a gate 14. Gate 14 extends into corner region 25 of trench 19, between oxide plug 33 and gate insulator 15. Trench 19, including gate 14 and oxide plug 33 therein, is covered with an insulative layer 16, which may be borophosphosilicate glass (BPSG). Electrical contact to source regions 11 and body region 12 is made with a conductor 17, which is typically a metal or metal alloy. Gate 14 is contacted in the third dimension, outside of the plane of FIG. 4.

The trench MOSFET of FIG. 4 uses oxide plug 33 to separate gate 14 from N-epi layer 13, thereby decreasing the gate-to-drain capacitance, $C_{gd}$. Having the channel extend around corner region 25 to the bottom of the trench precludes significant gate-to-drain overlap in thin gate oxide regions (i.e., see thin gate oxide regions 24 in FIG. 3) because the diffusion of body region 12 can be very well controlled through corner region 25. Since lateral diffusion is six to ten times slower than vertical diffusion, the pn junction between body region 12 and N-epi layer 13 can be made to coincide with the transition between thin gate insulator 15 and oxide plug 33. Thus, oxide plug 33 and active corner region 25 minimize the gate-to-drain capacitance, $C_{gd}$, with minimum impact on on-resistance, $R_{on}$, yielding a trench MOSFET 40 useful for high frequency applications.

Figure 5A:
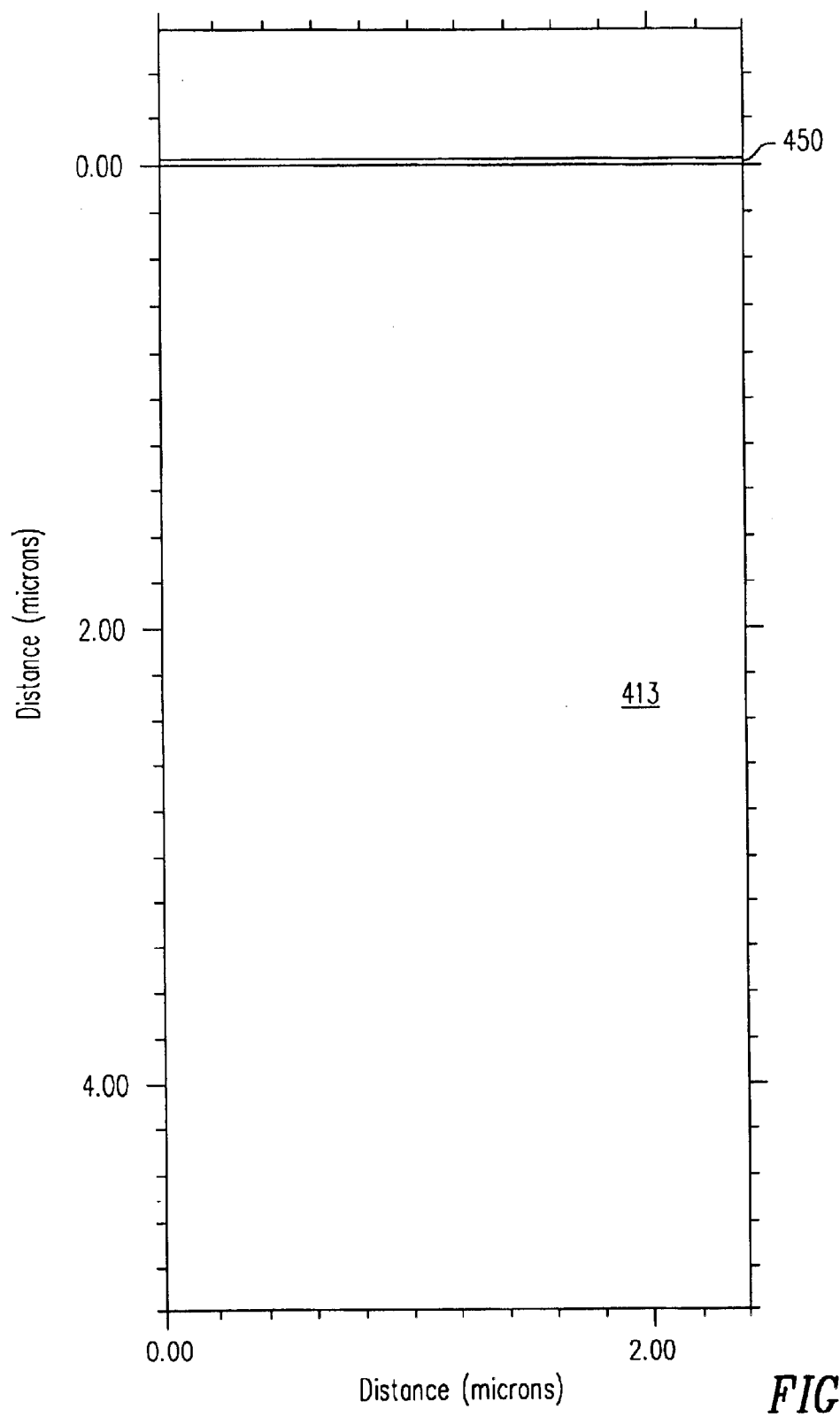
FIGS. 5A–5P are cross-sectional views illustrating one embodiment of a process for fabricating a trench MOSFET in accordance with the present invention.
Figure 5B:
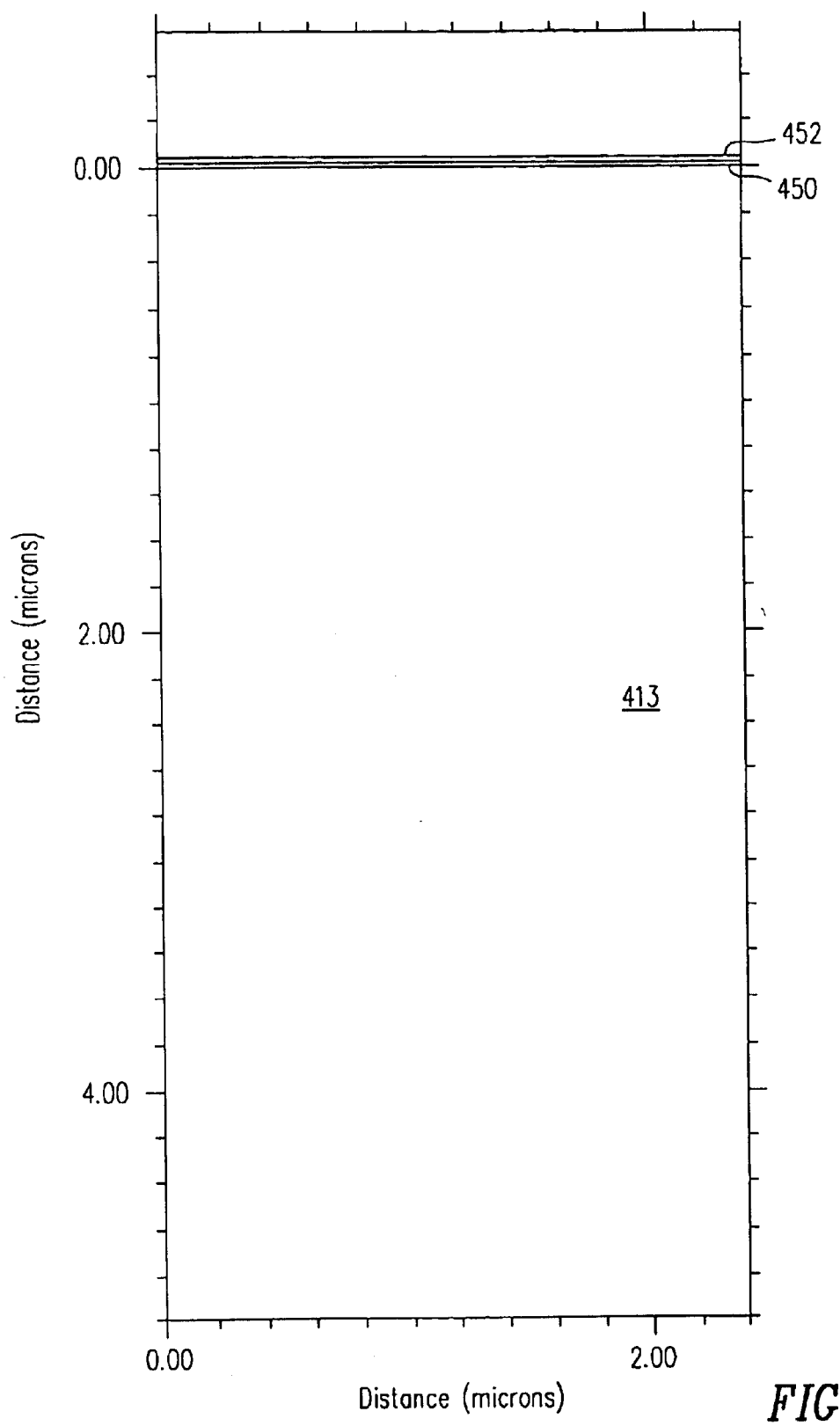
Figure 5C:
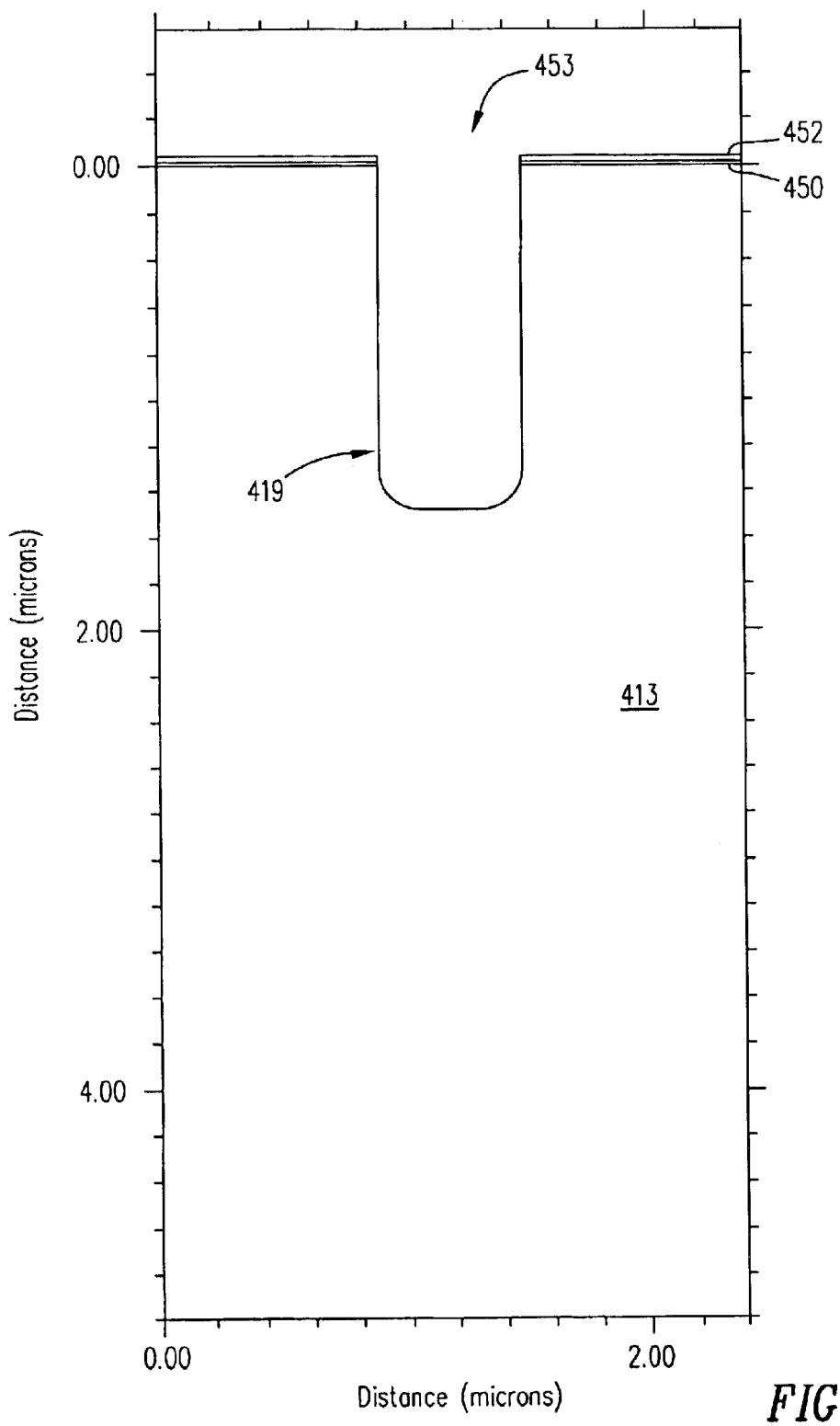
Figure 5D:
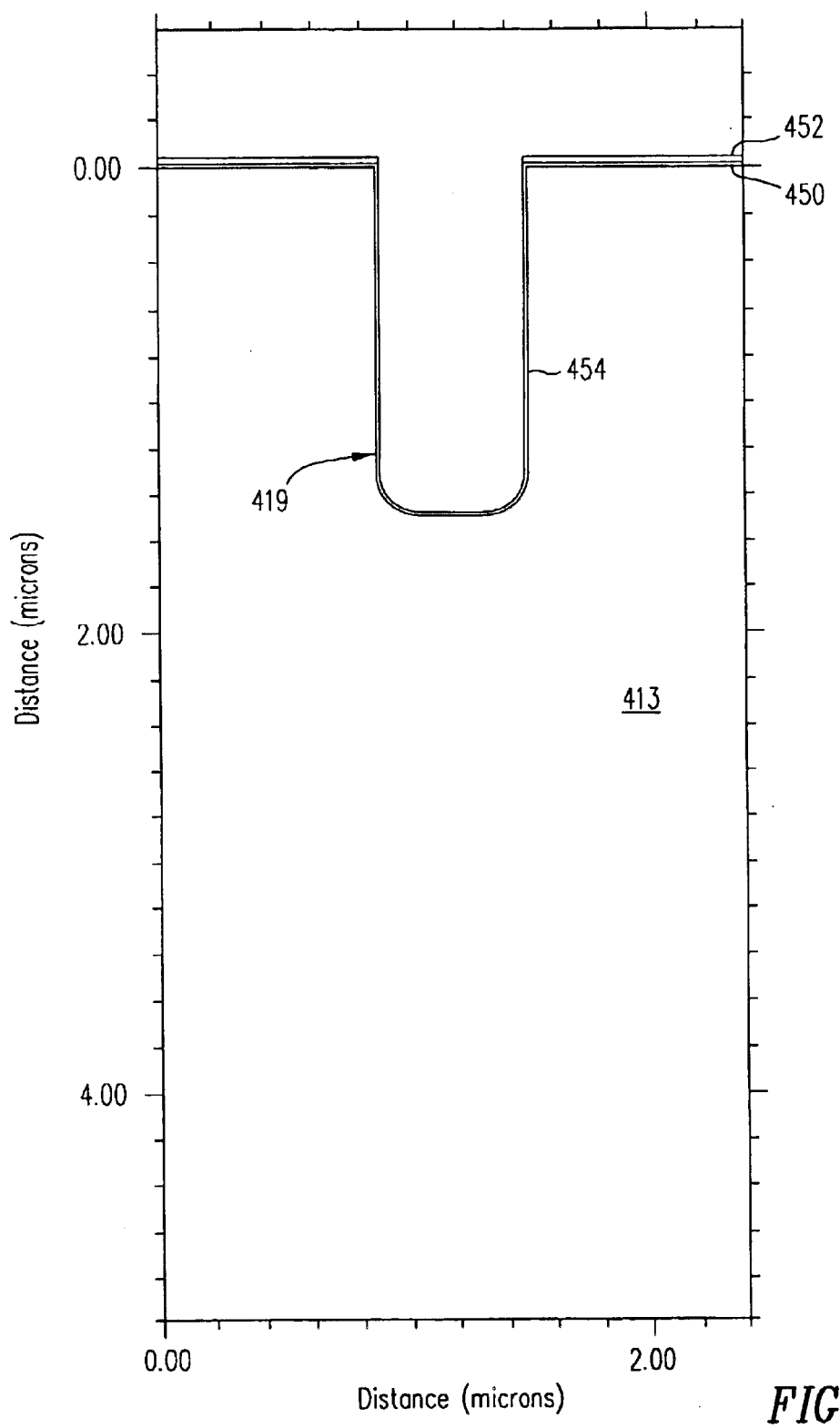
Figure 5E:
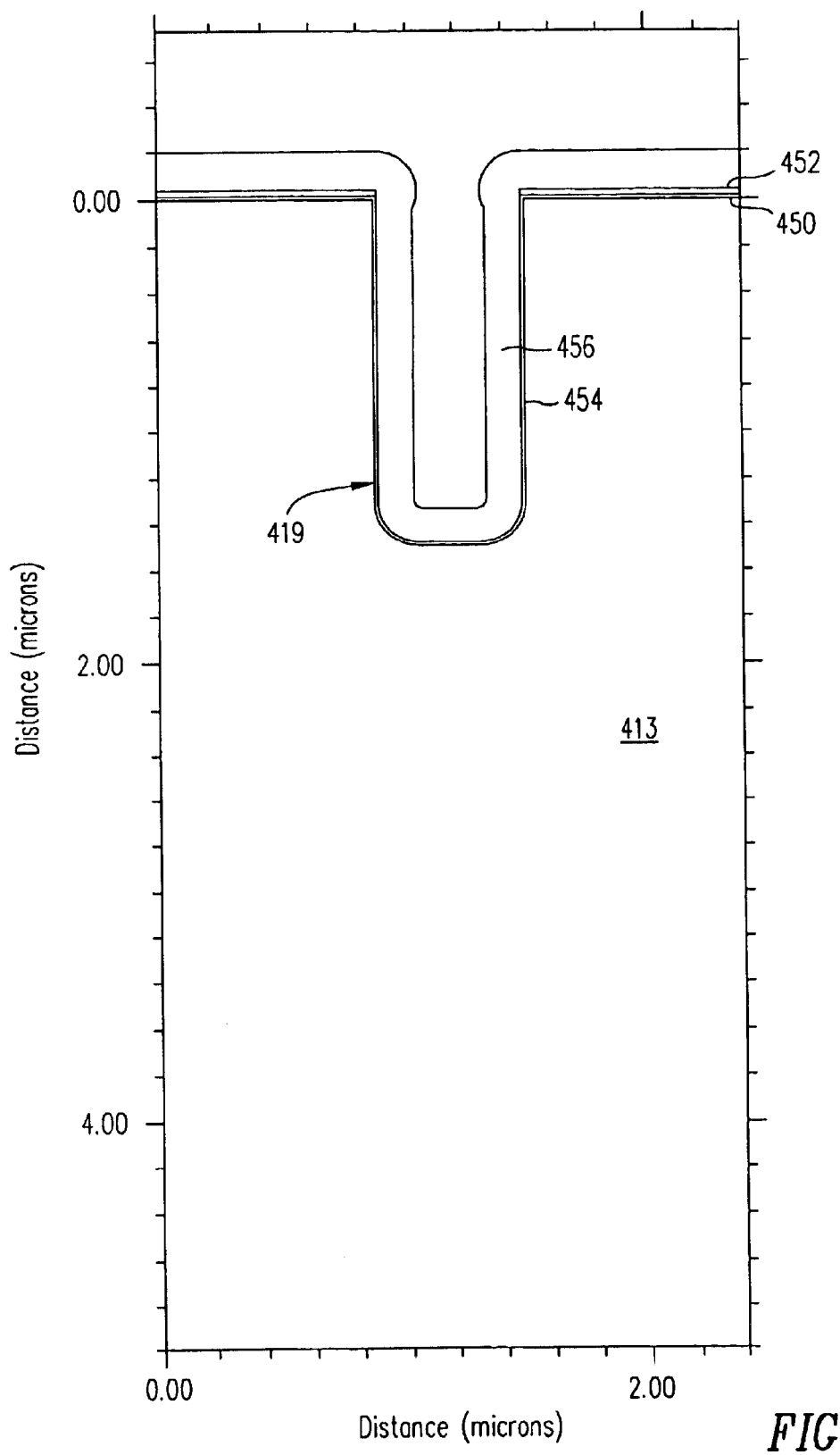
Figure 5F:
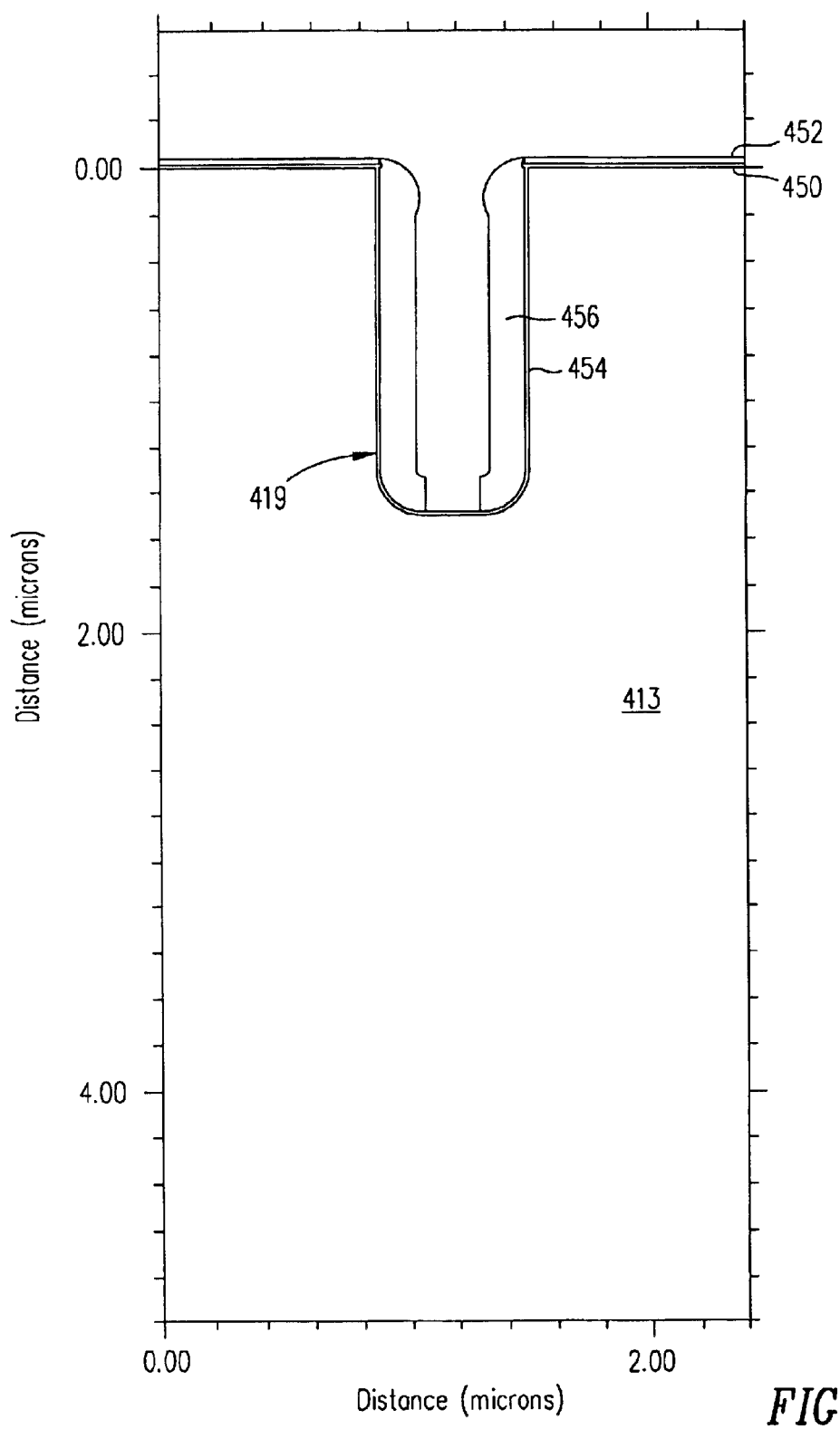
Figure 5G:
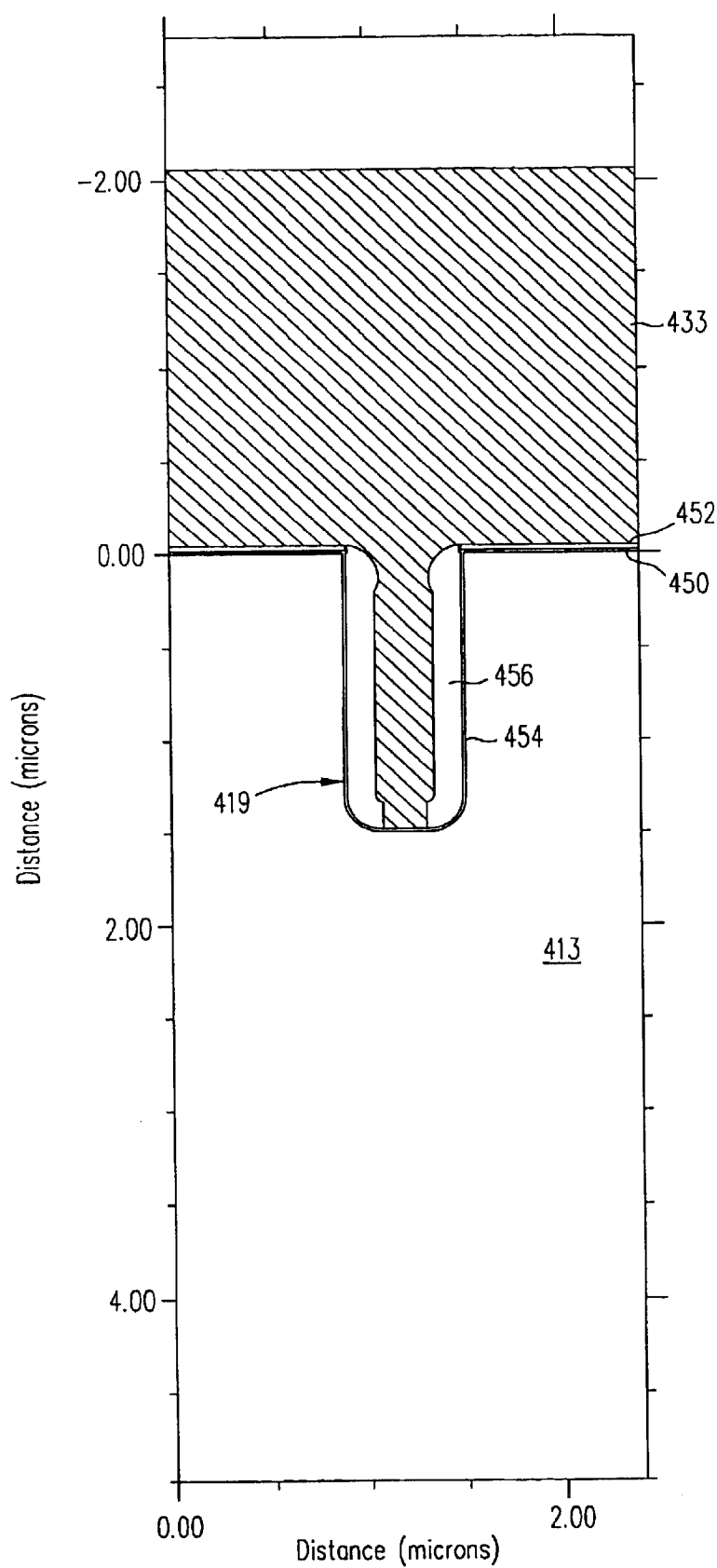
Figure 5H:
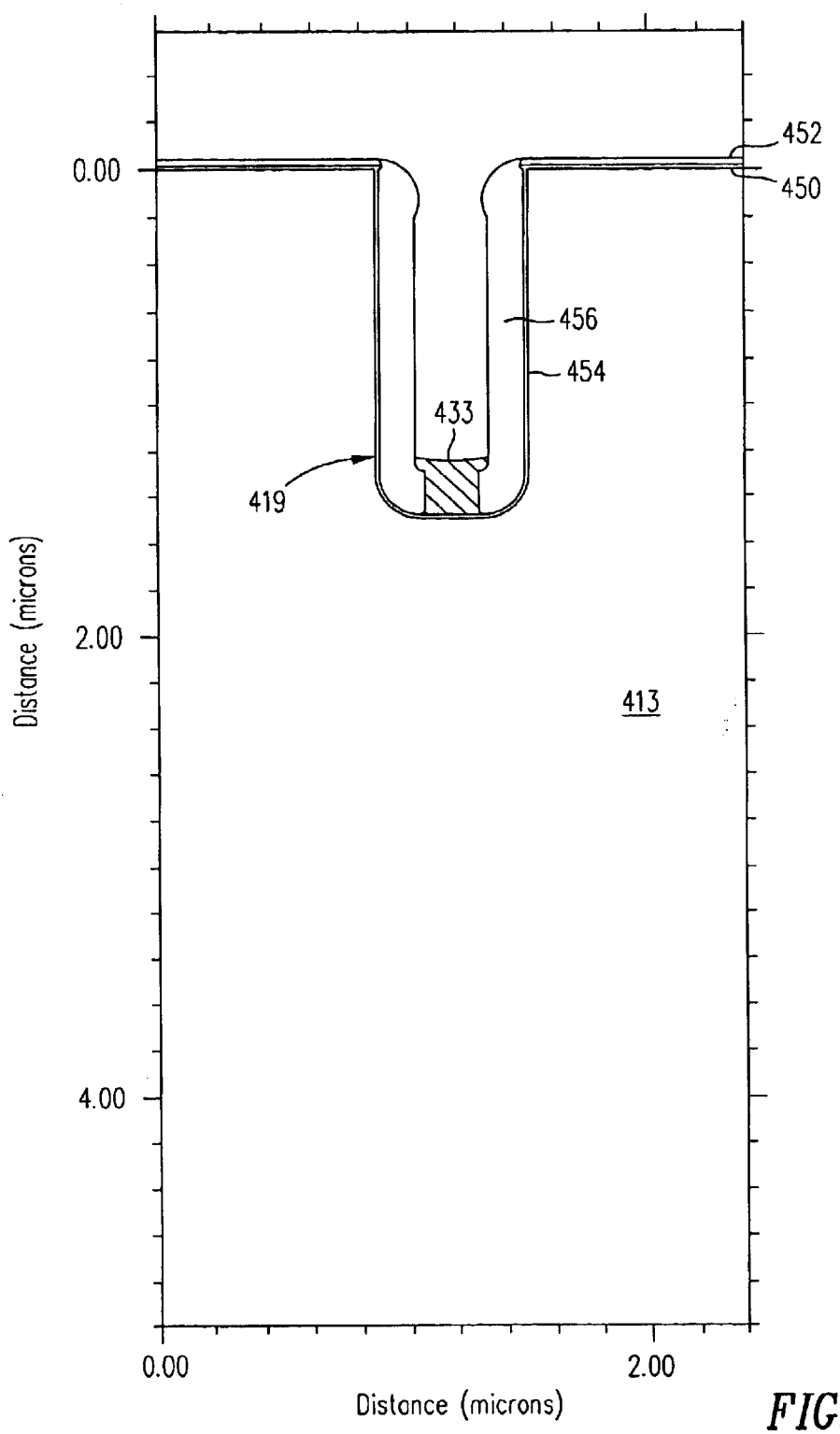
Figure 5I:
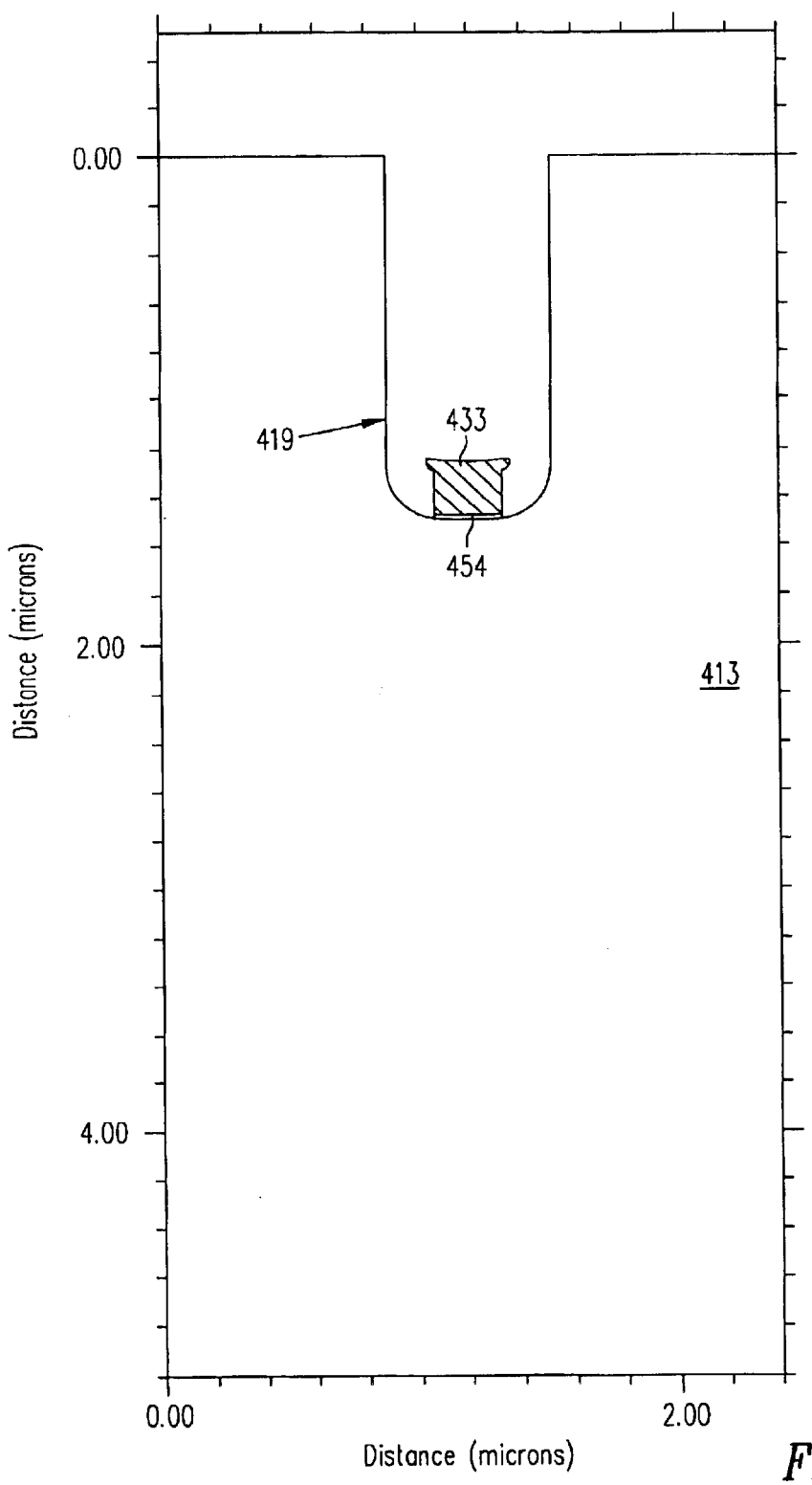
Figure 5J:
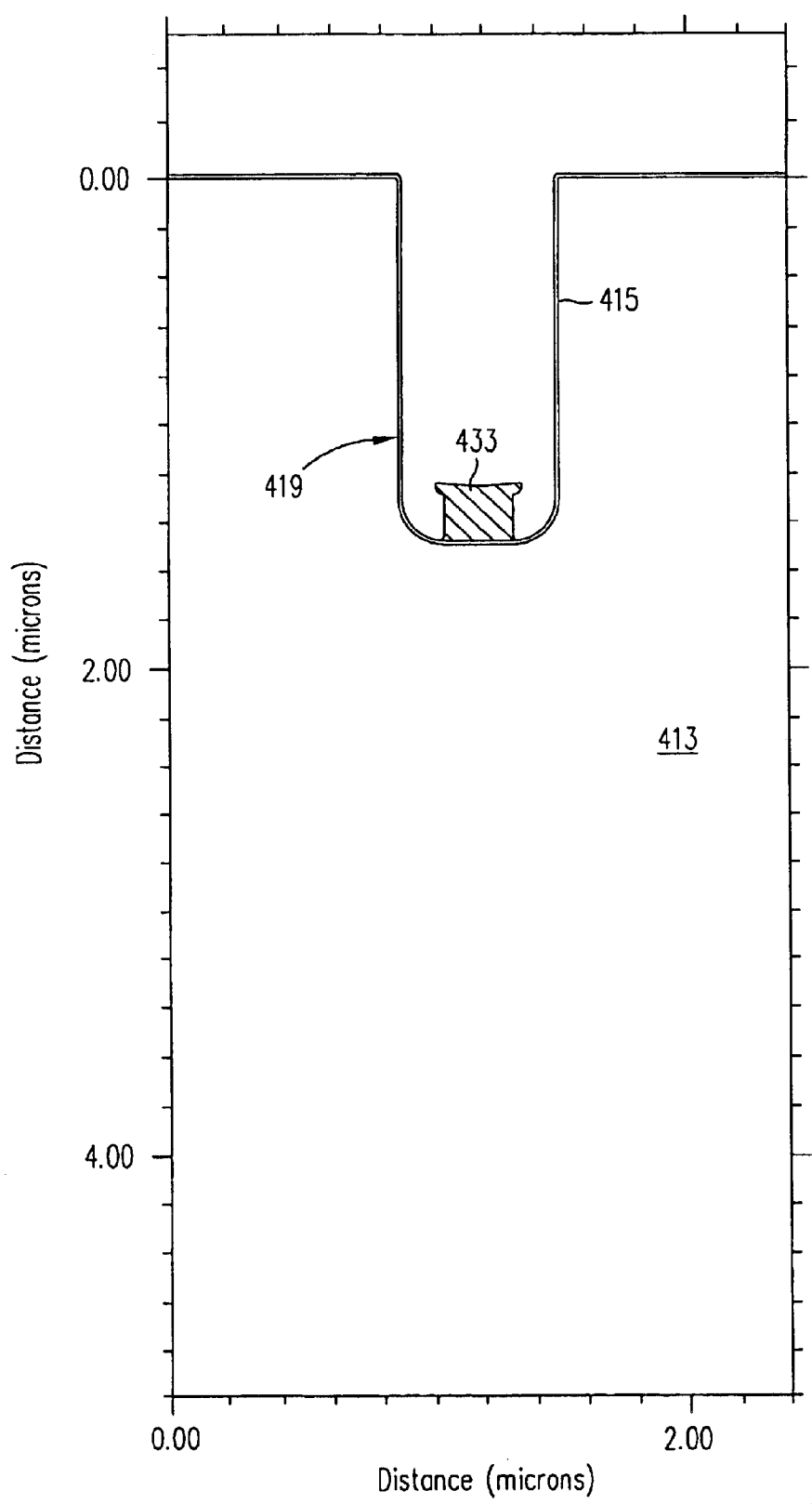
Figure 5K:
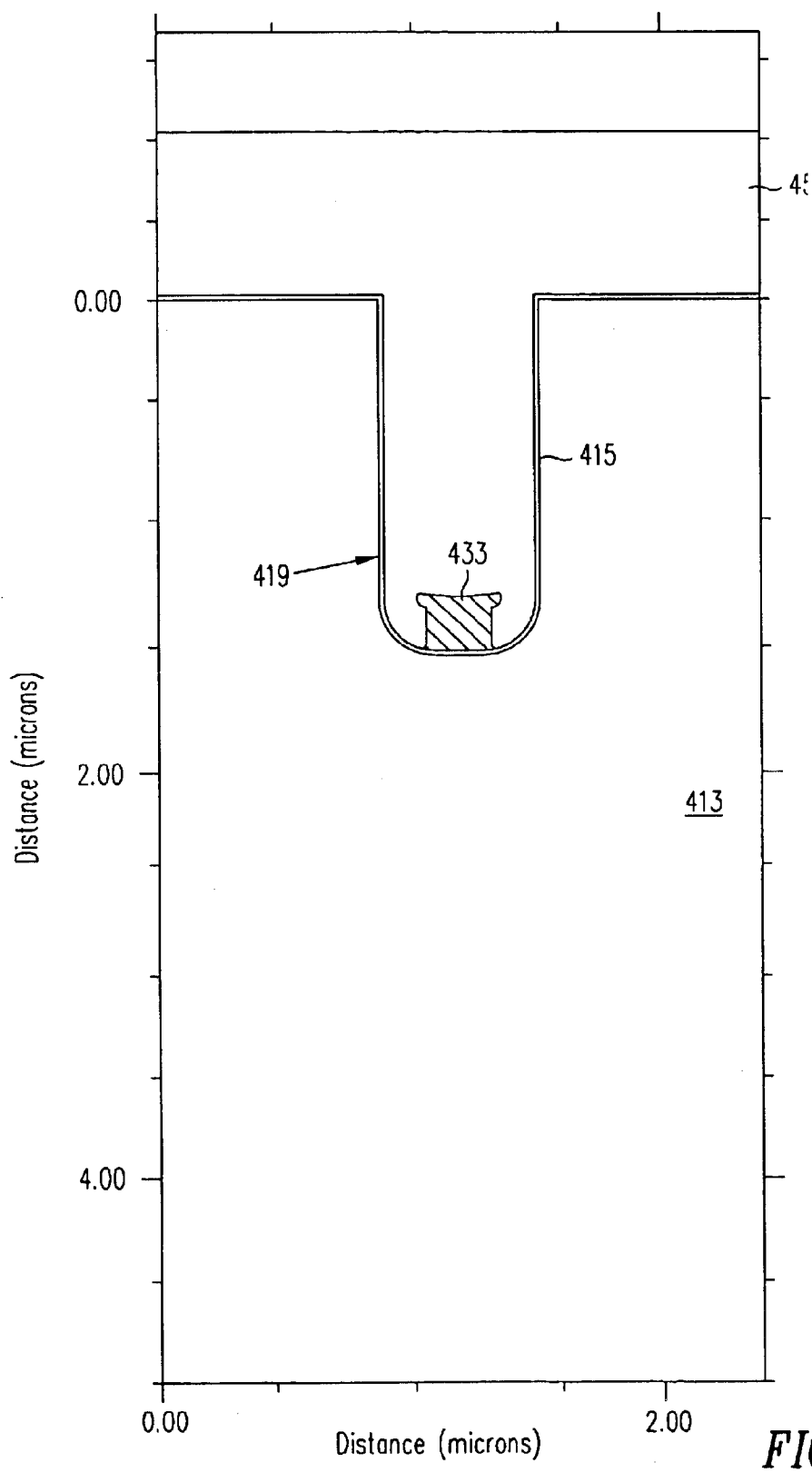
Figure 5L:
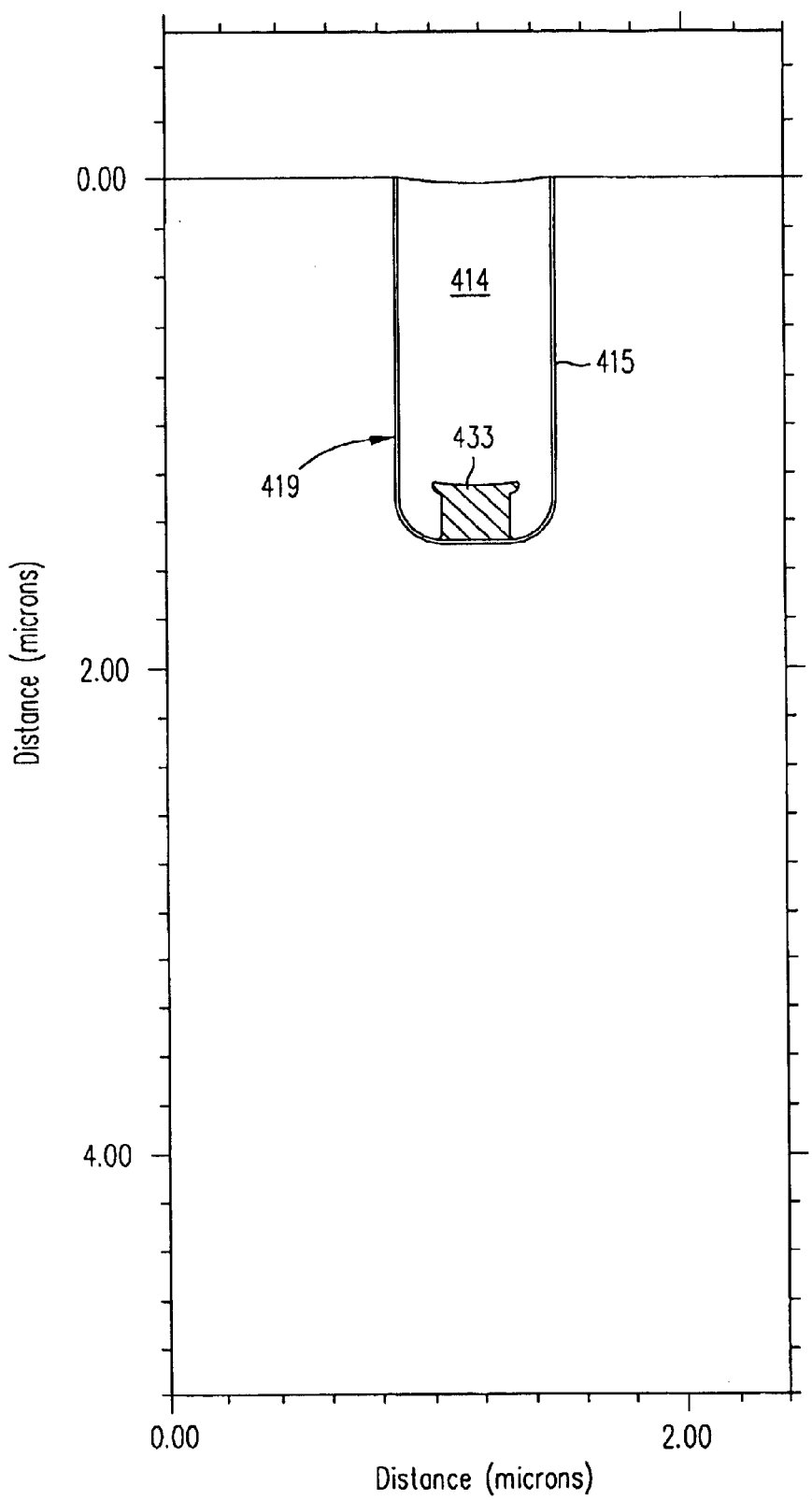
Figure 5M:
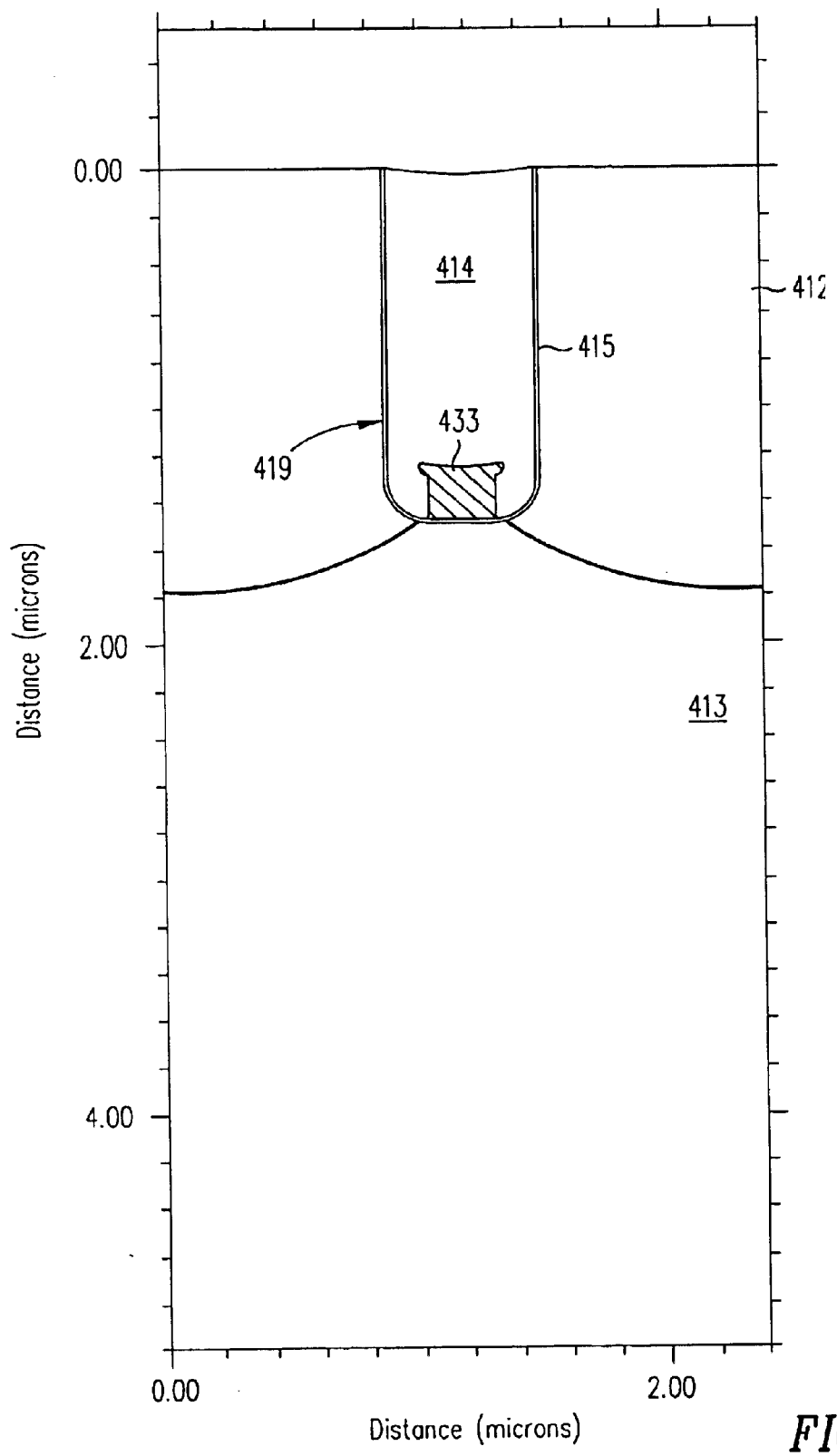
Figure 5N:
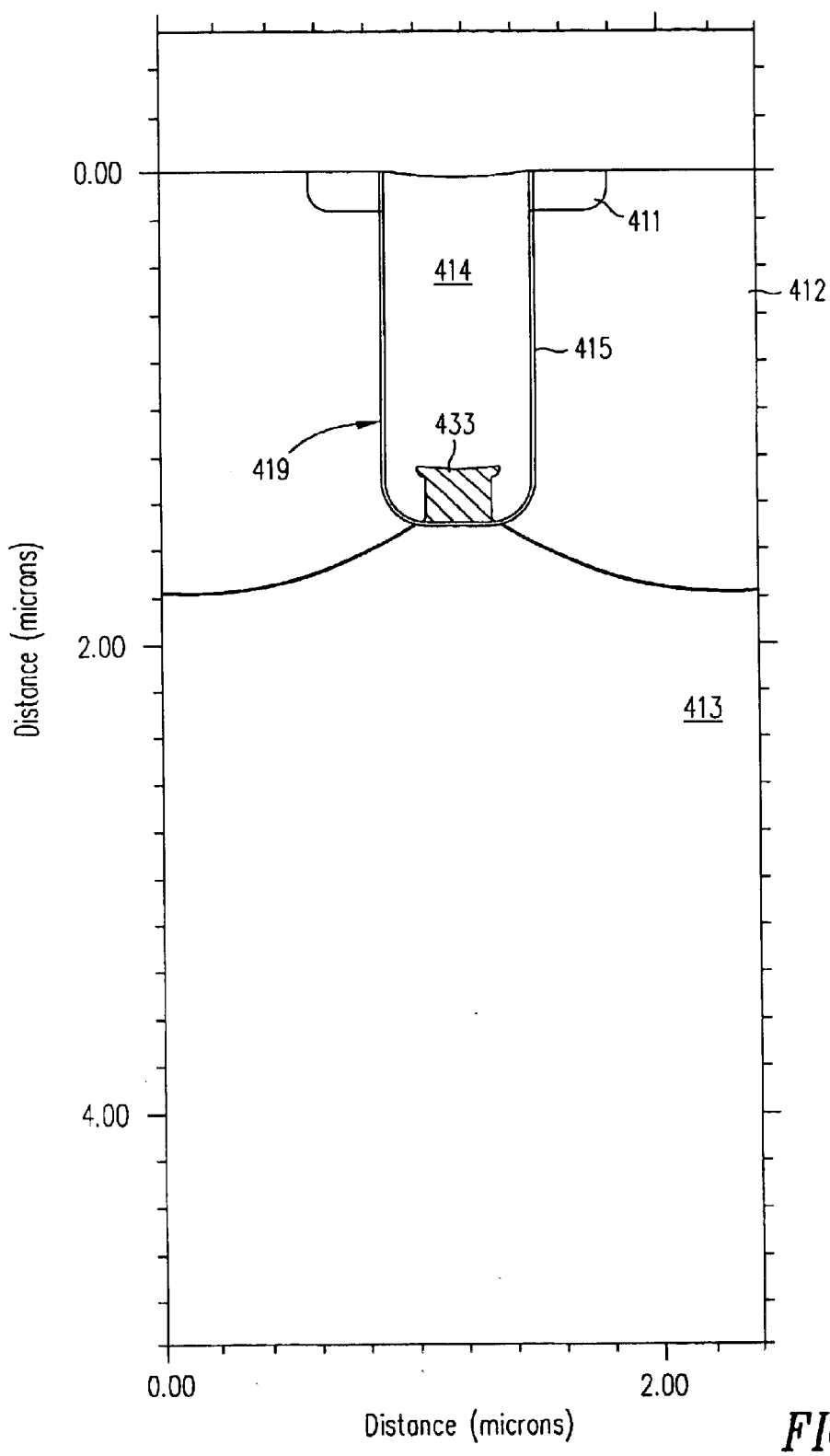
Figure 50:
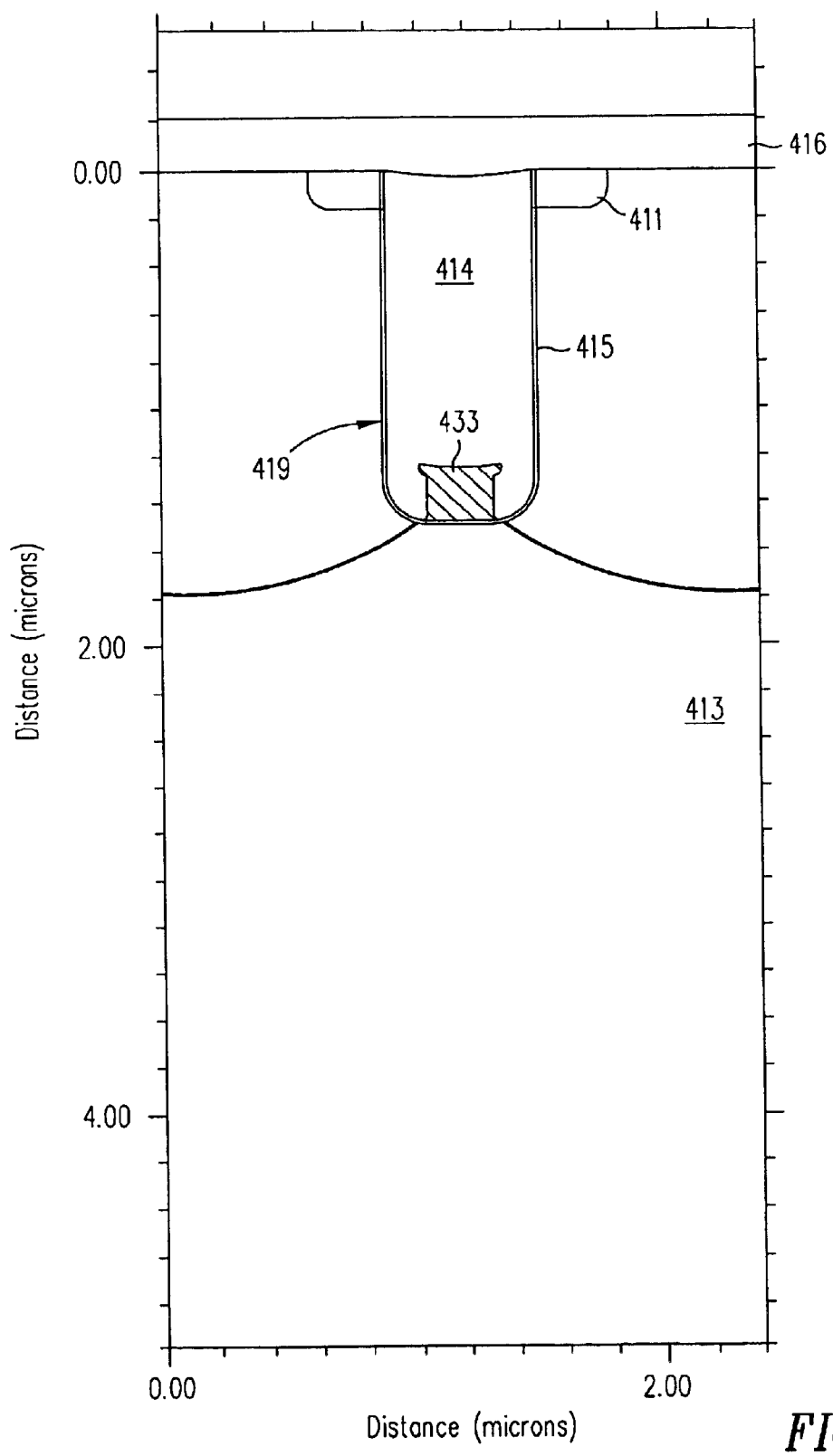
Figure 5P:
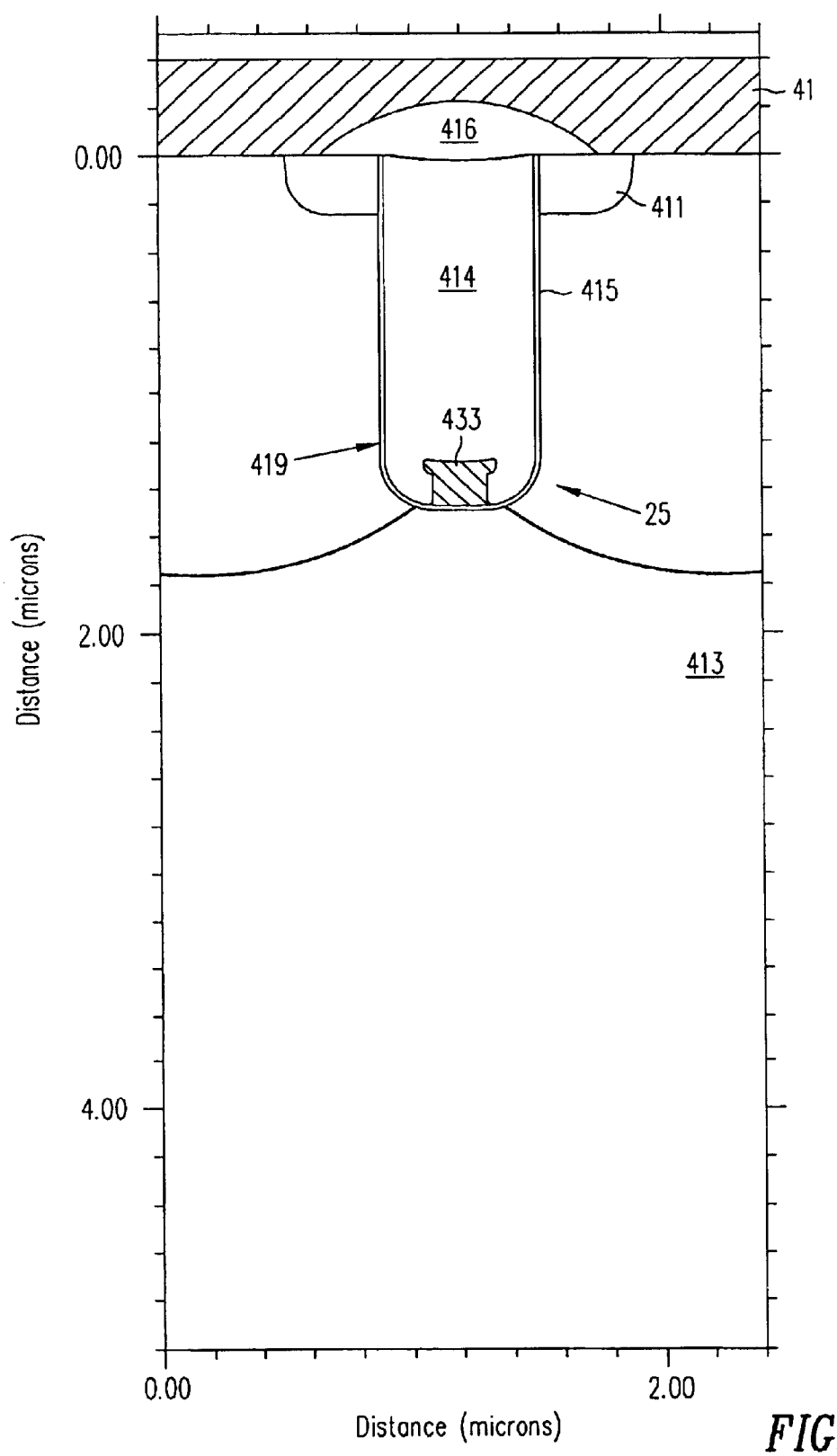

FIGS. 5A–5P are cross-sectional views illustrating one embodiment of a process for fabricating a trench MOSFET, such as MOSFET 40 of FIG. 4, in accordance with the present invention. As shown in FIG. 5A, the process begins with a lightly-doped N-epi layer 413 (typically about 8 μm thick) grown on a heavily doped N$^+$ substrate (not shown). A pad oxide 450 (e.g., 100–200 Å) is thermally grown by dry oxidation at 950° C. for 10 minutes on N-epi layer 413. As shown in FIG. 5B, a nitride layer 452 (e.g., 200–300 Å) is deposited by chemical vapor deposition (CVD) on pad oxide 450. As shown in FIG. 5C, nitride layer 452 and pad oxide 450 are patterned to form an opening 453 where a trench 419 is to be located. Trench 419 is etched through opening 453, typically using a dry plasma etch, for example, a reactive ion etch (RIE). Trench 419 may be about 0.5–1.2 μm wide and about 1–2 μm deep.

A second pad oxide 454 (e.g., 100–200 Å) is thermally grown on the sidewall and bottom of trench 419, as shown in FIG. 5D. A thick nitride layer 456 (e.g., 1000–2000 Å) is deposited conformally by CVD on the sidewall and bottom of trench 419 as well as on top of nitride layer 452, as shown in FIG. 5E. Nitride layer 456 is etched using a directional, dry plasma etch, such as an RIE, using etchants that have high selectivity for nitride layer 456 over pad oxide 450. The nitride etch leaves spacers of nitride layer 456 along the sidewall of trench 419, while exposing pad oxide 454 in the central bottom portion of trench 419, as shown in FIG. 5F. It is possible that nitride layer 456 may be overetched to such a degree that nitride layer 452 is removed from the top of pad oxide 450.

As shown in FIG. 5G, a thick insulative layer 433 (e.g., 2–4 μm) is then deposited. The deposition process is chosen, according to conventional deposition techniques such as CVD, to be non-conformal, filling trench 419 and overflowing onto the top surface of N-epi layer 413. Thick insulative layer 433 may be, for example, a low temperature oxide (LTO), a phosphosilicate glass (PSG), a BPSG, or another insulative material.

Insulative layer 433 is etched back, typically by performing a wet etch, using an etchant that has high selectivity for insulative layer 433 over nitride layer 456. Insulative layer 433 is etched back into trench 419 until only about 0.1–0.2 μm remains in trench 419, as shown in FIG. 5H.

Nitride layer 456 is removed, typically by performing a wet etch, using an etchant that has high selectivity for nitride layer 456 over insulative layer 433. Pad oxide 450 is also removed, typically by a wet etch. This wet etch will remove a small, but insignificant portion of insulative layer 433, leaving the structure as shown in FIG. 5I.

In some embodiments, an approximately 500 Å sacrificial gate oxide (not shown) can be thermally grown by dry oxidation at 1050° C. for 20 minutes and removed by a wet etch to clean the sidewall of trench 419. The wet etch of such a sacrificial gate oxide is kept short to minimize etching of insulative layer 433.

As shown in FIG. 5J, a thin gate insulator 415 (e.g., about 300–1000 Å thick) is then formed on the sidewall of trench 419 and the top surface of N-epi layer 413. Thin gate insulator 415 may be, for example, a silicon dioxide layer that is thermally grown using a dry oxidation at 1050° C. for 20 minutes.

As shown in FIG. 5K, a conductive material 456 is deposited by CVD, possibly by low pressure CVD (LPCVD), to fill trench 419 and overflow past the topmost surface of thin gate insulator 415. Conductive material 456 may be, for example, an in-situ doped polysilicon, or an undoped polysilicon layer that is subsequently implanted and annealed, or an alternative conductive material. Conductive material 456 is etched, typically using a reactive ion etch, until the top surface of material 456 is approximately level with the top of N-epi layer 413, thereby forming gate 414, as shown in FIG. 5L. In an n-type MOSFET, gate 414 may be, for example, a polysilicon layer with a doping concentration of $10^{20}$ cm$^{-3}$. In some embodiments, conductive material 456 maybe etched past the top of trench 419, thereby recessing gate 414 to minimize the gate-to-source overlap capacitance.

Using known implantation and diffusion processes, P-type body regions 412 are formed in N-epi layer 413 as shown in FIG. 5M. Body regions 412 are diffused such that the PN junctions between p-type body regions 412 and the remainder of N-epi layer 413 are located near the interface between thick insulative layer 433 and thin gate insulator 415. This interface occurs at a location along the bottom of trench 419, where the diffusion of body regions 412 is dominated by lateral diffusion under trench 419 rather than vertical diffusion deeper into N-epi layer 413, making control of the diffusion of body regions 412 easier.

Using known implantation and diffusion processes, N$^+$ source regions 411 are formed in N-epi layer 413 as shown in FIG. 5N.

As shown in FIG. 5O, an insulative layer 416, which may be borophosphosilicate glass (BPSG), is deposited by CVD on the surfaces of N-epi layer 413 and gate 414. Insulative layer 416 is etched, typically using a dry etch, to expose portions of p-type body regions 412 and N$^+$ source regions 411, as shown in FIG. 5P. Electrical contact to body regions 412 and source regions 411 is made with a conductor 417, which is typically a deposited (e.g., by physical vapor deposition) metal or metal alloy. Electrical contact to gate 414 is made in the third dimension, outside of the plane of FIG. 5P. Electrical contact to the drain (not shown) is made to the opposite surface of the N$^+$ substrate (not shown) on which N-epi layer 413 is grown.

This method thus allows incorporation of thick insulative layer 433, centrally positioned at the bottom of trench 419, to decrease $C_{gd}$ with minimal undesirable effects or manufacturing concerns. For example, stress effects from growing a thick oxide in the concave bottom of trench 419 are avoided by depositing the oxide rather than thermally growing it. In addition, by keeping corner region 25 active (i.e., part of the MOSFET channel), the gate-to-drain overlap in thin gate oxide regions 24 of MOSFET 30 (see FIG. 3) are avoided. This minimizes $C_{gd}$.

Figure 6:
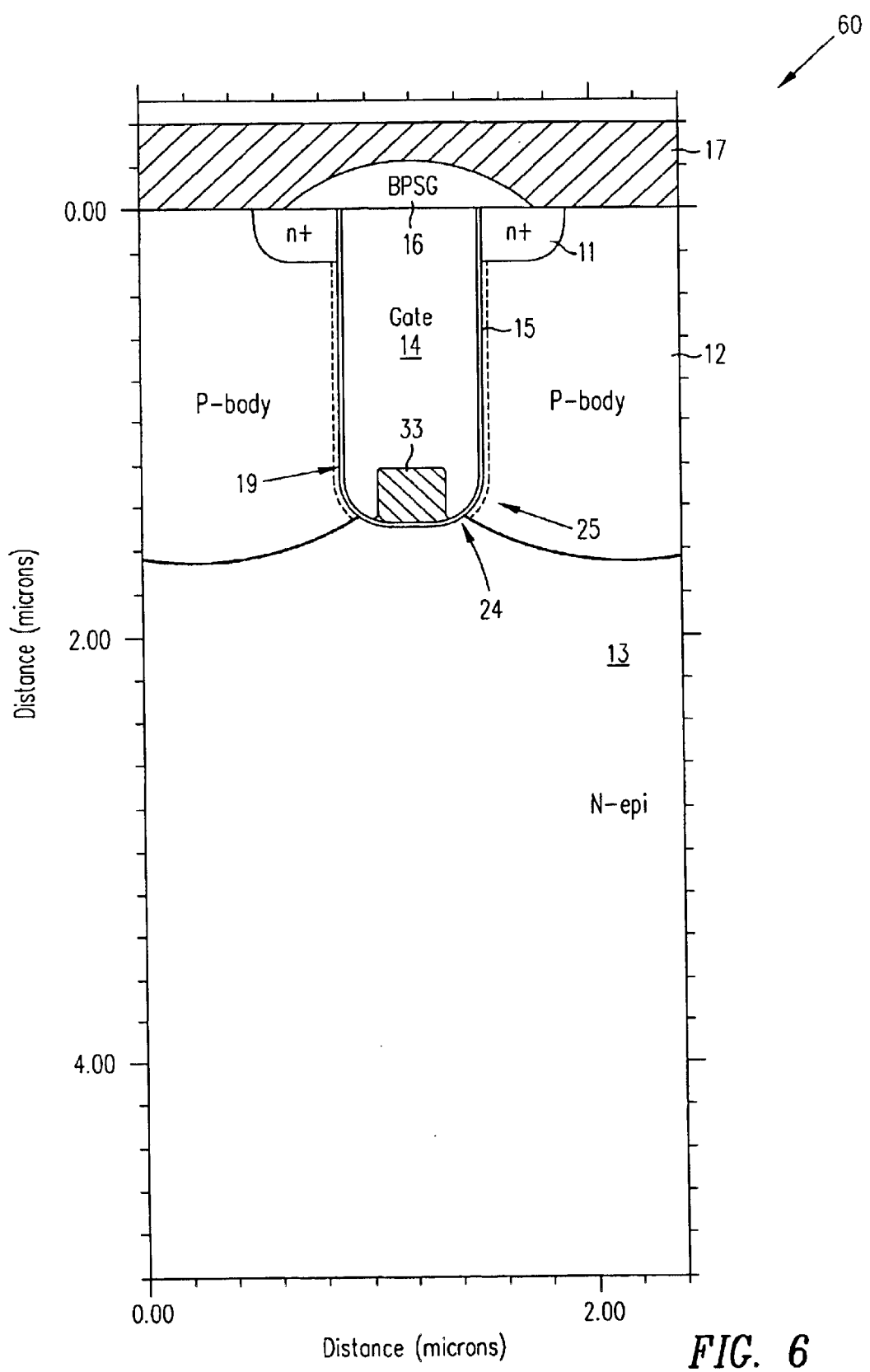
FIG. 6 is a cross-sectional view of an alternative embodiment of a trench MOSFET in accordance with the present invention.

FIG. 6 is a cross-sectional view of an alternative embodiment of a trench MOSFET 60 in accordance with the present invention. MOSFET 60 has many similarities to MOSFET 40 of FIG. 4. In particular, the sidewall and corner region 25 of trench 19 are lined with thin gate insulator 15, while oxide plug 33 is centrally located in the bottom of trench 19. In FIG. 6, however, the PN junctions between body regions 12 and N-epi layer 13 are not located as near to the interface between oxide plug 33 and thin gate insulator 15 as in MOSFET 40 of FIG. 4. In fact, the location of the PN junctions between body regions 12 and N-epi layer 13 can vary. As discussed above with reference to FIG. 5M, body regions 412 are formed using known implantation and diffusion techniques. The structure of MOSFET 60 of FIG. 6 can be fabricated by varying the diffusion conditions associated with the diffusion of body regions 12 so that diffusion stops before body regions 12 reach the interface of oxide plug 33.

Figure 1:
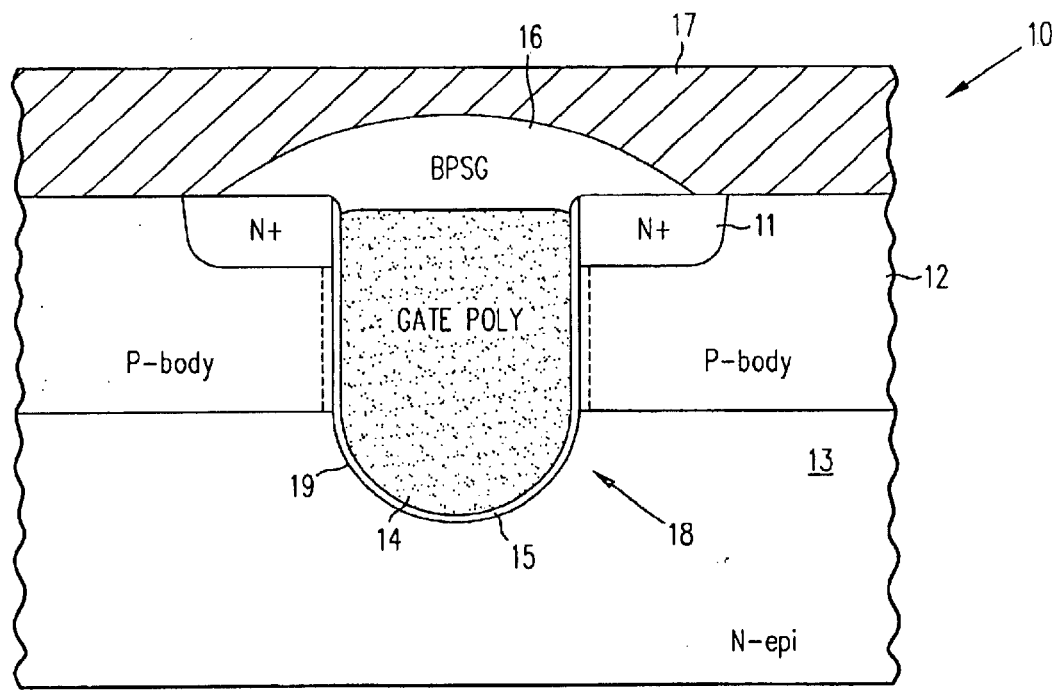
FIG. 1 is a cross-sectional view of a conventional trench MOSFET.
Figure 2:
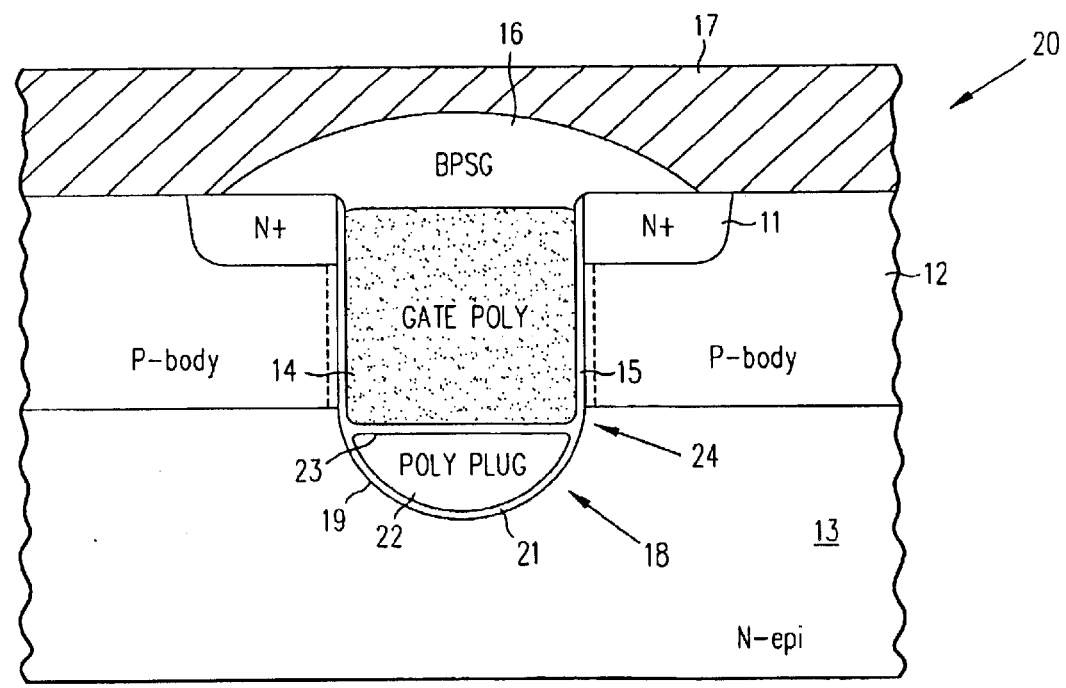
FIG. 2 is a cross-sectional view of a trench MOSFET with a polysilicon plug at the bottom of the trench.
Figure 3:
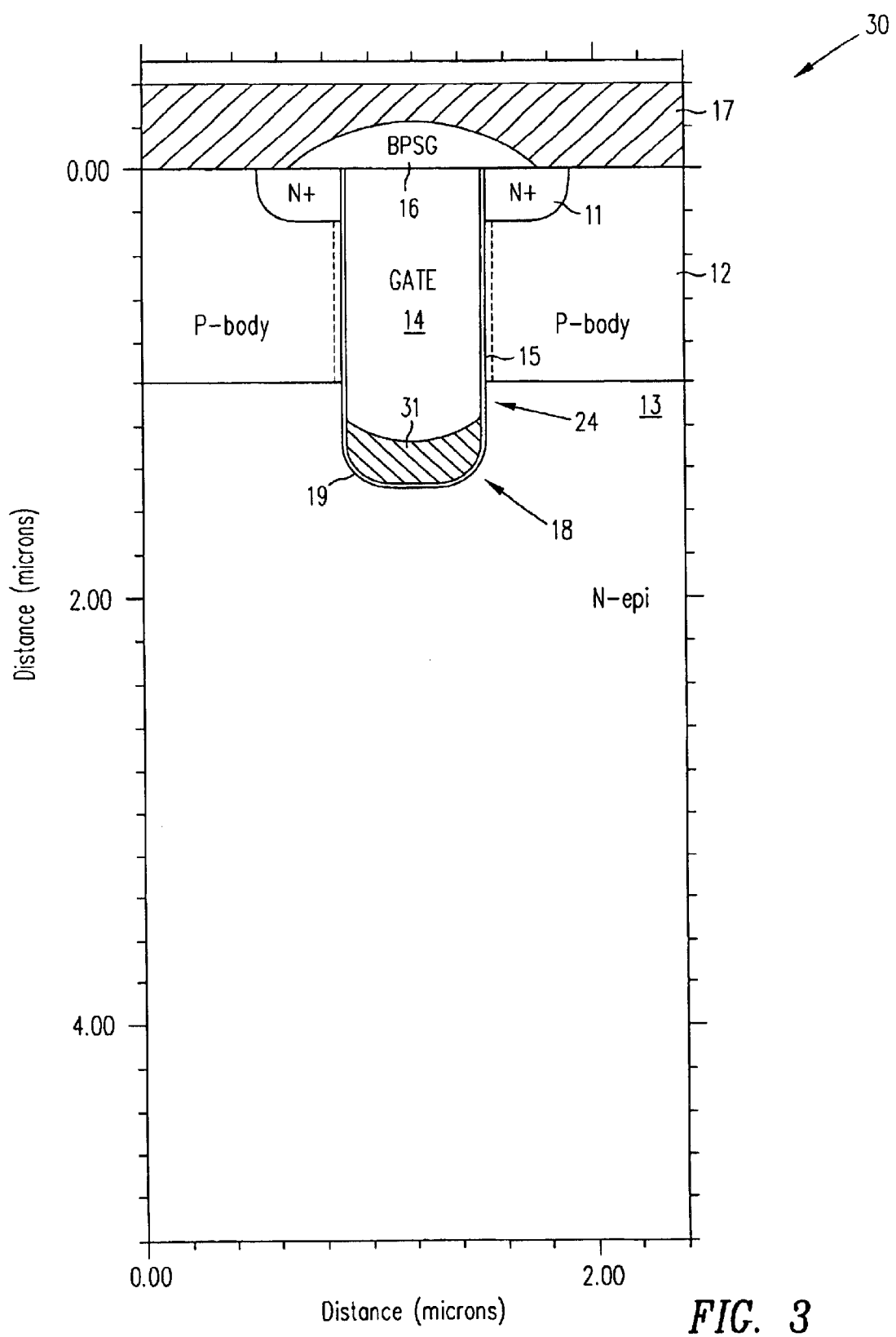
FIG. 3 is a cross-sectional view of a trench MOSFET with a thick insulative layer at the bottom of the trench.

MOSFET 60 of FIG. 6 exhibits reduced gate-to-drain capacitance, $C_{gd}$, compared to MOSFET 10 of FIG. 1, MOSFET 20 of FIG. 2, and MOSFET 30 of FIG. 3. MOSFET 10 of FIG. 1 has a large $C_{gd}$ due to thin gate insulator 15 throughout overlap region 18. MOSFET 20 of FIG. 2 and MOSFET 30 of FIG. 3 have large $C_{gd}$ due to thin gate insulator 15 throughout thin gate oxide regions 24, since regions 24 may be large due to the fast nature of vertical diffusion. The extent of thin gate oxide region 24 in MOSFET 60 of FIG. 6, however, can be minimized since the diffusion of body regions 12 in thin gate oxide region 24 will be dominated by lateral diffusion under trench 19, instead of vertical diffusion deeper into N-epi layer 13.

Figure 7:
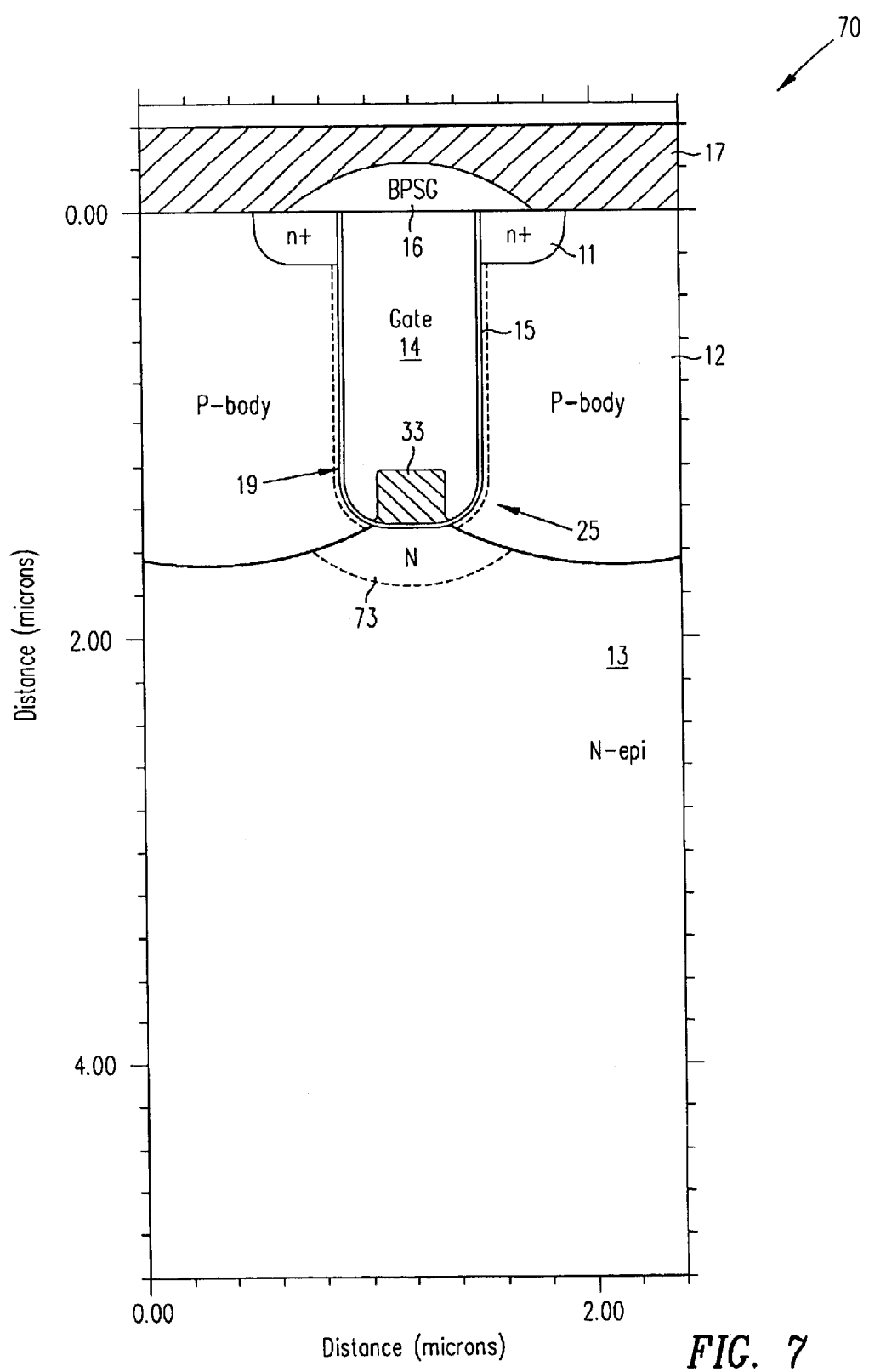
FIG. 7 is a cross-sectional view of an alternative embodiment of a trench MOSFET in accordance with the present invention.

FIG. 7 is a cross-sectional view of an alternative embodiment of a trench MOSFET 70 in accordance with the present invention. MOSFET 70 has many similarities to MOSFET 40 of FIG. 4. In particular, the sidewall and corner region 25 of trench 19 are lined with thin gate insulator 15, while oxide plug 33 is centrally located in the bottom of trench 19. In MOSFET 40 of FIG. 4, oxide plug 33 may increase the on-resistance ($R_{on}$) of MOSFET 40 due to an increase in the spreading resistance in the accumulation layer at the bottom of trench 19. MOSFET 70 of FIG. 7, however, includes a high doping region 73 at the bottom of trench 19 to help spread current more effectively and minimize pinching of body region 12. High doping region 73 also helps self-align the PN junction between p-type body regions 412 and N-epi layer 413 to the edge of thick insulative layer 433, during the diffusion process shown in FIG. 5M. Highly doped region 73 is formed in N-epi layer 13. Highly doped region 73 may be created by implanting an n-type dopant, such as arsenic or phosphorous, after trench 19 is etched as shown in FIG. 5C, after pad oxide 454 is formed as shown in FIG. 5D, or after nitride layer 456 is etched as shown in FIG. 5F. Thus, oxide plug 33 minimizes gate-to-drain capacitance, $C_{gd}$, and highly doped region 73 minimizes on-resistance, $R_{on}$, yielding a trench MOSFET 70 well-suited for high frequency applications.

As mentioned above, positioning the transition between the thick and thin sections of the gate oxide layer at the bottom of the trench is advantageous in aligning the transition with the junction between the body region and the N-epi region because the body region diffuses more slowly in a lateral direction than in a vertical direction. In another variation according to this invention, this alignment is further improved by forming a gradual transition between the thick and thin sections of the gate oxide layer.

The process may be identical to that described above through the step illustrated in FIG. 5F, where the nitride etch leaves spacers of nitride mask layer 456 along the sidewall of trench 419, while exposing pad oxide 454 in the central bottom portion of trench 419. In the next step, however, instead of depositing a thick insulating layer by, for example, CVD, a thick oxide layer is grown by a thermal process. When this is done, the thermal oxide consumes part of the silicon and thereby undercuts the edges of the nitride layer, causing the nitride layer to "lift off" of the surface of the trench. This forms a structure that is similar to the "bird's beak" in a conventional LOCOS (local oxidation of silicon) process that is often used to create field oxide regions on the top surface of a semiconductor device.

Figure 8:
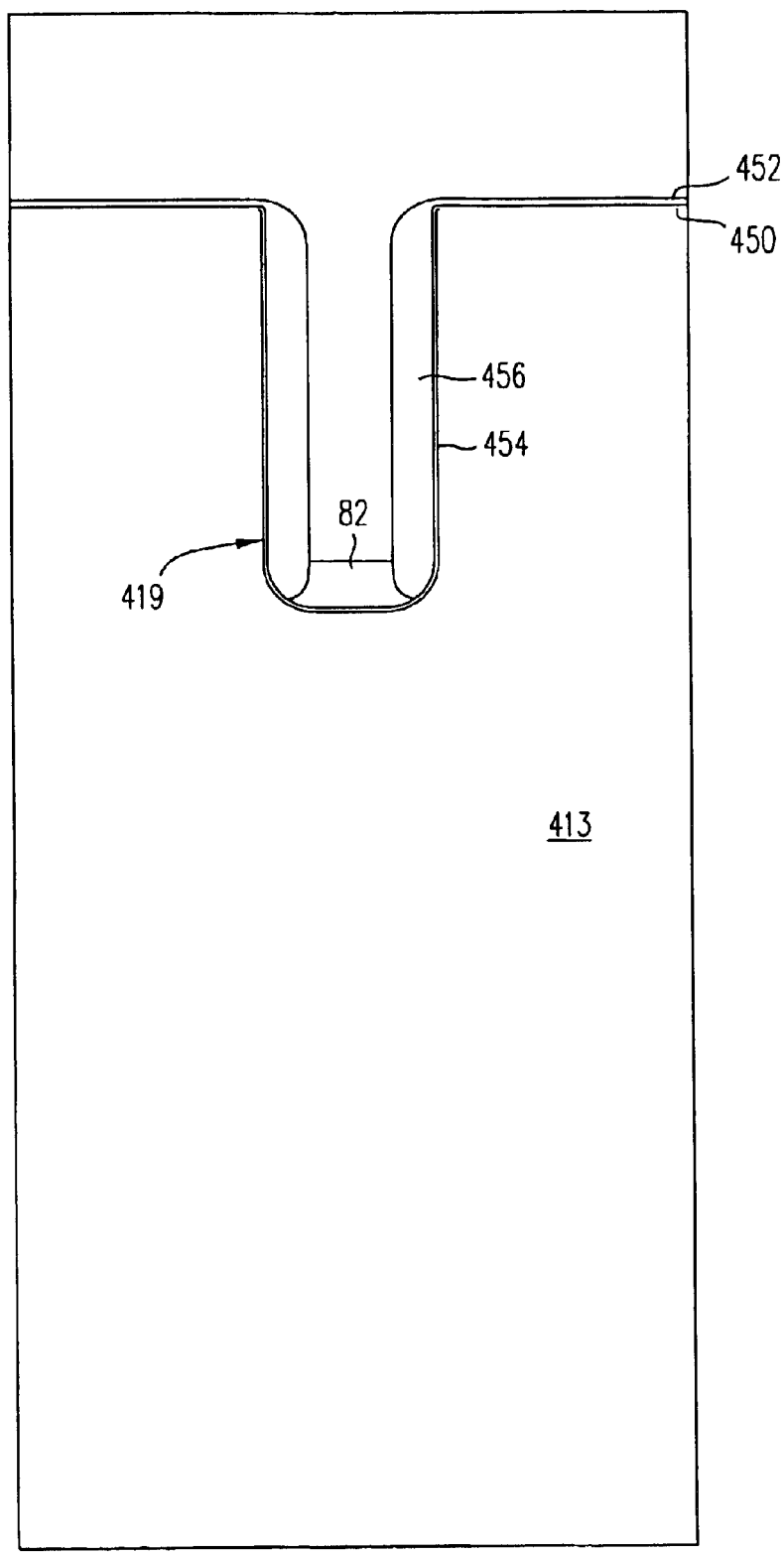
FIG. 8 is a cross-sectional view taken during the fabrication of yet another alternative embodiment

FIG. 8 shows the structure after a thermal oxide layer 82 has been grown at the bottom of trench 419. The structure is shown in detail in FIG. 9A. The edges of thermal oxide layer 82 have pushed under nitride layer 456 and as a result become sloped or tapered.

Figure 9A:
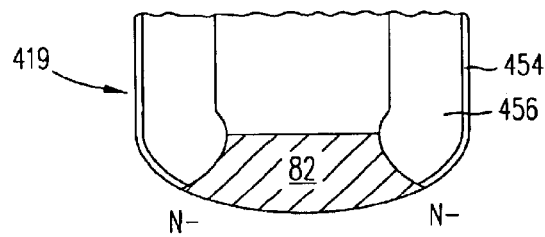
FIGS. 9A–9C show three variations of the embodiment of FIG. 8.
Figure 9C:
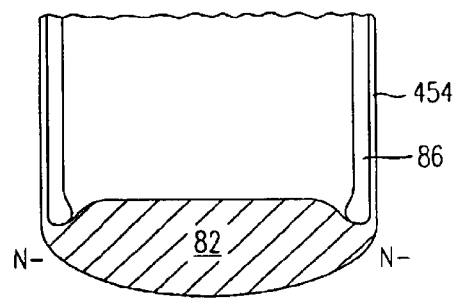
Figure 9B:
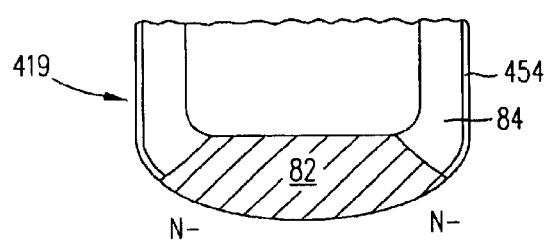

Altering the thickness of the nitride layer allows one to position the edges of the oxide layer at different locations. FIG. 9A shows a relatively thick nitride layer 456, and as a result the edges of oxide layer 82 are located on the bottom of trench 419. FIG. 9B shows a thinner nitride layer 84, with the edges of oxide layer 82 located essentially at the corners of trench 419. FIG. 9C shows an even thinner nitride layer 86 with the edges of oxide layer 82 located on the sidewalls of trench 419.

In a similar manner, the edges of the oxide layer may be positioned at various intermediate points by altering the thickness of the nitride layer. The thickness of the nitride layer is independent of the width or depth of trench 419. For example, if the nitride layer is in the range of 1,500 to 2,000 Å thick, the edges of oxide layer 82 would most likely be located on the bottom of trench 419 (FIG. 9A). If the nitride layer is 500 Å or less thick, the edges of oxide layer 82 would typically be located on the sidewalls of trench 419 (FIG. 9C).

Oxide layer 82 may be grown, for example, by heating the silicon structure at a temperature from 1,000° C. to 1,200° C. for 20 minutes to one hour.

After the thermal oxide layer has been grown, the nitride layer may be removed by etching with a nitride etchant. To ensure that all of the nitride is removed, another anneal may be performed, for example, at 1,000° C. for 5–10 minutes to oxidize any remaining nitride, and the anneal may be followed by an oxide etch. The oxide etch removes any oxidized nitride but does not remove significant portions of oxide layer 82.

A gate oxide layer may then be grown, the trench may be filled with a gate material such as polysilicon, and the other steps described above and illustrated in FIGS. 5I–5P may be performed. With reference to FIG. 5M, the diffusion of P-type dopant is controlled such that the PN junction between P-body 412 and N-epi region 413 intersects the trench somewhere within the "bird's beak" area, where the thickness of the oxide layer is gradually decreasing. Thus the PN junction does not need to be located at a particular point.

Figure 10:
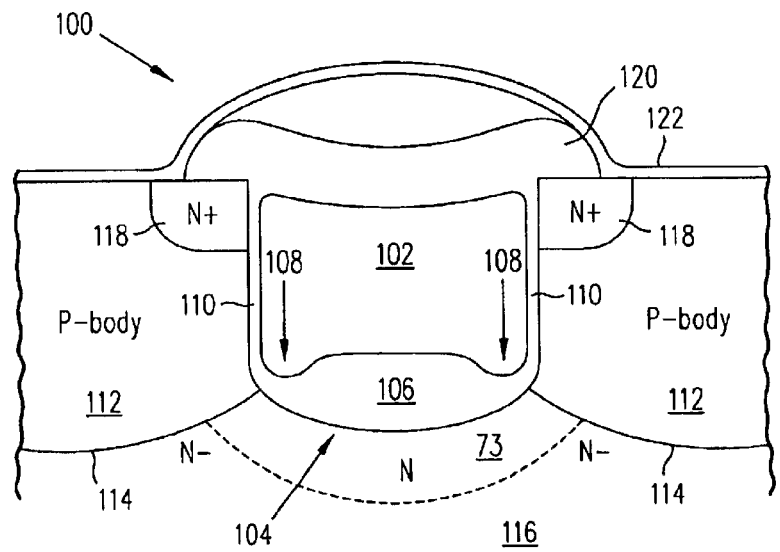
FIG. 10 is a cross-sectional view of the completed MIS device of FIG. 8.

FIG. 10 illustrates a MOSFET 100 fabricated in accordance with this embodiment of the invention. MOSFET 100 includes a gate electrode 102 that is positioned in a trench 104, which is lined with an oxide layer. The upper surface of gate electrode 102 is recessed into trench 104. The oxide layer includes a thick section 106, formed in accordance with this invention, which is located generally at the bottom of trench 104, and relatively thin sections 110 adjacent the sidewalls of trench 104. Between thick section 106 and thin sections 110 are transition regions 108, where the thickness of the oxide layer decreases gradually from thick section 106 to thin sections 110. MOSFET 100 also includes P-body regions 112, which form PN junctions 114 with an N-epi region 116. PN junctions 114 intersect trench 104 in the transition regions 108. As described above, the location of transition regions 108 can be varied by altering the thickness of the nitride layer during the fabrication of MOSFET 100.

MOSFET 100 also includes N+ source regions 118, a thick oxide layer 120 overlying gate electrode 102, and a metal layer 122 that makes electrical contact with P-body regions 112 and N+ source regions 118. As shown by the dashed lines, MOSFET 100 may contain a highly doped region 73 at the bottom of trench 104. Highly doped region 73 may be created by implanting an n-type dopant, such as arsenic or phosphorous, after the trench has been formed as shown in FIG. 5C, after the pad oxide has been formed as shown in FIG. 5D, or after the nitride layer has been etched as shown in FIG. 5F.

Fabricating a device in accordance with this embodiment allows a greater margin of error in the positioning of the PN junction between the P-body region and the N-epi. Compared with MOSFET 40 shown in FIG. 4, for example, the body-drain junctions do not need to be precisely positioned at the sharp edges of oxide plug 33. In addition, the breakdown characteristics of the MOSFET are enhanced because the thickness of the oxide at the trench corners can be increased without increasing the thickness of the gate oxide near the channel region and thereby raising the threshold voltage.

The foregoing embodiments are intended to be illustrative and not limiting of the broad principles of this invention. Many additional embodiments will be apparent to persons skilled in the art. For example, the structures and methods of this invention can be used with any type of metal-insulator-semiconductor (MIS) device in which it is desirable to form an insulating layer between a trench gate and a region outside the trench, while minimizing the gate-to-drain overlap regions. Also, various insulative or conductive materials can be used where appropriate, and the invention is also applicable to p-type MOSFETs. The invention is limited only by the following claims.

We claim:

1. A method of fabricating an MIS device comprising:

providing a semiconductor substrate;

forming a trench in said substrate;

depositing a nitride layer in said trench;

etching said nitride layer to form an exposed area at a bottom of said trench; said etching exposing a lateral surface of said nitride layer on each side of said exposed area;

heating the substrate and thereby growing an oxide layer in said exposed area, said oxide layer abutting said lateral surface of said nitride layer on each side of said exposed area;

removing said nitride layer;

forming a relatively thin gate oxide layer on at least a portion of a sidewall of said trench; and forming a gate in said trench.

2. The method of claim 2, wherein forming a gate comprises:

depositing doped polysilicon in said trench; and etching said doped polysilicon to a level about equal to a surface of said substrate.

3. A method of fabricating an MIS device comprising:

providing a semiconductor substrate;

forming a trench in said substrate;

depositing a nitride layer in said trench;

etching said nitride layer to form an exposed area at a bottom of said trench;

heating the substrate and thereby growing an oxide layer in said exposed area;

removing a portion of said nitride layer;

oxidizing a remaining portion of said nitride layer to form oxidized nitride;

removing said oxidized nitride forming a relatively thin gate oxide layer on at least a portion of a sidewall of said trench; and forming a gate in said trench.

4. The method of claim 1 wherein growing an oxide layer comprises causing a portion of said nitride layer to lift oft from a surface of said trench.

5. The method of claim 1 wherein depositing a nitride layer comprises depositing a nitride layer 500 Å or less thick.

6. The method of claim 1 wherein depositing a nitride layer comprises depositing a nitride layer in the range of 1,500 to 2,000 Å thick.

7. The method of claim 1 wherein growing an oxide layer comprises creating a transition region wherein a thickness of the oxide layer gradually decreases in a direction away form said exposed area.

8. The method of claim 7 wherein the substrate is of a first conductivity type, the method further comprising diffusing dopant of a second conductivity type into said substrate, said dopant forming a PN junction with a remaining portion of said substrate.

9. A method of fabricating an MIS device comprising:

providing a semiconductor substrate of a first conductivity type;

forming a trench in said substrate;

depositing a nitride layer in said trench;

etching said nitride layer to form an exposed area at a bottom of said trench;

heating the substrate and thereby growing an oxide layer in said exposed area, thereby creating a transition region wherein a thickness of the oxide layer gradually decreases in a direction away form said exposed area; and diffusing dopant of a second conductivity type into said substrate, said dopant forming a PN junction with a remaining portion of said substrate;

wherein diffusing dopant of said second conductivity type comprises controlling the diffusion of said PN junction such that said PN junction intersects the trench in said transition region.

10. The method of claim 1 comprising implanting dopant through a bottom of said trench to form a heavily doped region adjacent said bottom of said trench.

11. The method of claim 1 wherein etching said nitride layer comprises a directional etch.

12. The method of claim 1 wherein etching said nitride layer comprises a directional, dry plasma etch.

13. The method of claim 1 wherein etching said nitride layer comprises a reactive ion etch.

14. The method of claim 1 wherein said etching said nitride layer leaves a remaining section of said nitride layer covering a corner area of said trench.

* * * * *